United States Patent
Frey et al.

(10) Patent No.: US 10,825,936 B2
(45) Date of Patent: Nov. 3, 2020

(54) DEVICE FOR DETECTING ELECTROMAGNETIC RADIATION HAVING AN ENCAPSULATING STRUCTURE INCLUDING AT LEAST ONE INTERFERENCE FILTER

(71) Applicant: Commissariat a l'energie atomique et aux energies alternatives, Paris (FR)

(72) Inventors: Laurent Frey, Fontaine (FR); Salim Boutami, Grenoble (FR); Jean-Jacques Yon, Sassenage (FR)

(73) Assignee: Commissariat a l'energie atomique et aux energies alternatives, Paris (FR)

( * ) Notice: Subject to any disclaimer, the term of this patent is extended or adjusted under 35 U.S.C. 154(b) by 92 days.

(21) Appl. No.: 15/494,715

(22) Filed: Apr. 24, 2017

(65) Prior Publication Data
US 2017/0309758 A1   Oct. 26, 2017

(30) Foreign Application Priority Data

Apr. 25, 2016   (FR) ..................................... 16 53609

(51) Int. Cl.
*H01L 31/0216*   (2014.01)
*G01J 5/10*   (2006.01)
(Continued)

(52) U.S. Cl.
CPC .......... *H01L 31/02165* (2013.01); *G01J 3/26* (2013.01); *G01J 5/024* (2013.01);
(Continued)

(58) Field of Classification Search
CPC ... G01J 3/26; G01J 5/20; G01J 3/0256; G02B 26/001
(Continued)

(56) References Cited

U.S. PATENT DOCUMENTS 5,550,373 A   8/1996   Cole et al.
5,726,805 A   3/1998   Kaushik et al.
(Continued)

FOREIGN PATENT DOCUMENTS

DE   10 2011 111 883 A1   2/2013
WO   WO 96/21140   7/1996
WO   WO 2015/169761 A1   11/2015

OTHER PUBLICATIONS

French Preliminary Search Report dated Feb. 22, 2017 (with Written Opinion) in French Application 16 53609 filed on Apr. 25, 2016 (with English Translation of Categories of Cited Documents).
(Continued)

*Primary Examiner* — David Chen
(74) *Attorney, Agent, or Firm* — Oblon, McClelland, Maier & Neustadt, L.L.P.

(57) ABSTRACT

A device for detecting electromagnetic radiation includes at least one thermal detector, placed on a substrate; an encapsulating structure forming a cavity housing the thermal detector, including at least one thin encapsulating layer; and at least one Fabry-Perot interference filter, formed by first and second semi-reflective mirrors that are separated from each other by a structured layer. A high-index layer of one of the semi-reflective mirrors is at least partially formed from the thin encapsulating layer.

18 Claims, 12 Drawing Sheets

(51) Int. Cl.

| | | |
|---|---|---|
| *G01J 5/20* | (2006.01) | |
| *G01J 5/04* | (2006.01) | |
| *G01J 5/02* | (2006.01) | |
| *G02B 5/28* | (2006.01) | |
| *G01J 5/08* | (2006.01) | |
| *G02B 26/00* | (2006.01) | |
| *G01J 3/26* | (2006.01) | |
| *H01L 31/0203* | (2014.01) | |
| *G01J 3/02* | (2006.01) | |

(52) U.S. Cl.
CPC ............. *G01J 5/045* (2013.01); *G01J 5/0809* (2013.01); *G01J 5/10* (2013.01); *G01J 5/20* (2013.01); *G02B 5/288* (2013.01); *G02B 26/001* (2013.01); *H01L 31/0203* (2013.01); *G01J 3/0256* (2013.01)

(58) Field of Classification Search
USPC ................. 250/338.1, 339.02; 257/431, 433, 257/E31.093; 356/454; 359/247, 577
See application file for complete search history.

(56) References Cited

U.S. PATENT DOCUMENTS

| | | | |
|---|---|---|---|
| 8,933,389 B2 | 1/2015 | Boutami et al. | |
| 2005/0046919 A1* | 3/2005 | Taguchi | G02B 26/001 359/237 |
| 2008/0217539 A1 | 9/2008 | Talghader | |
| 2010/0294935 A1 | 11/2010 | Talghader | |
| 2013/0188903 A1* | 7/2013 | Sandhu | G02B 6/1223 385/14 |
| 2014/0264712 A1* | 9/2014 | Boutami | H01L 31/18 257/467 |
| 2015/0309095 A1 | 10/2015 | Monnerie et al. | |
| 2015/0316472 A1 | 11/2015 | Yon et al. | |
| 2016/0282181 A1* | 9/2016 | Shibayama | G01J 3/0286 |

OTHER PUBLICATIONS

Search Report dated Sep. 21, 2017 in European Patent Application No. 17167674.5, (with English translation of categories of cited documents), 8 pages.

\* cited by examiner

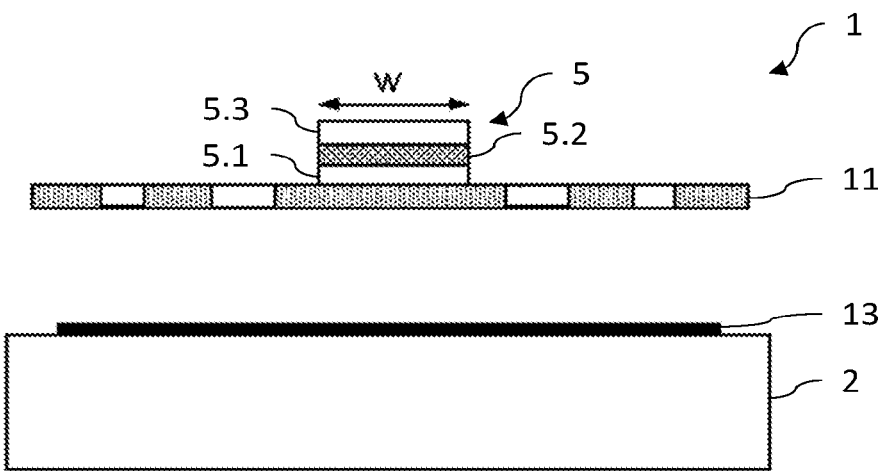
Fig.1
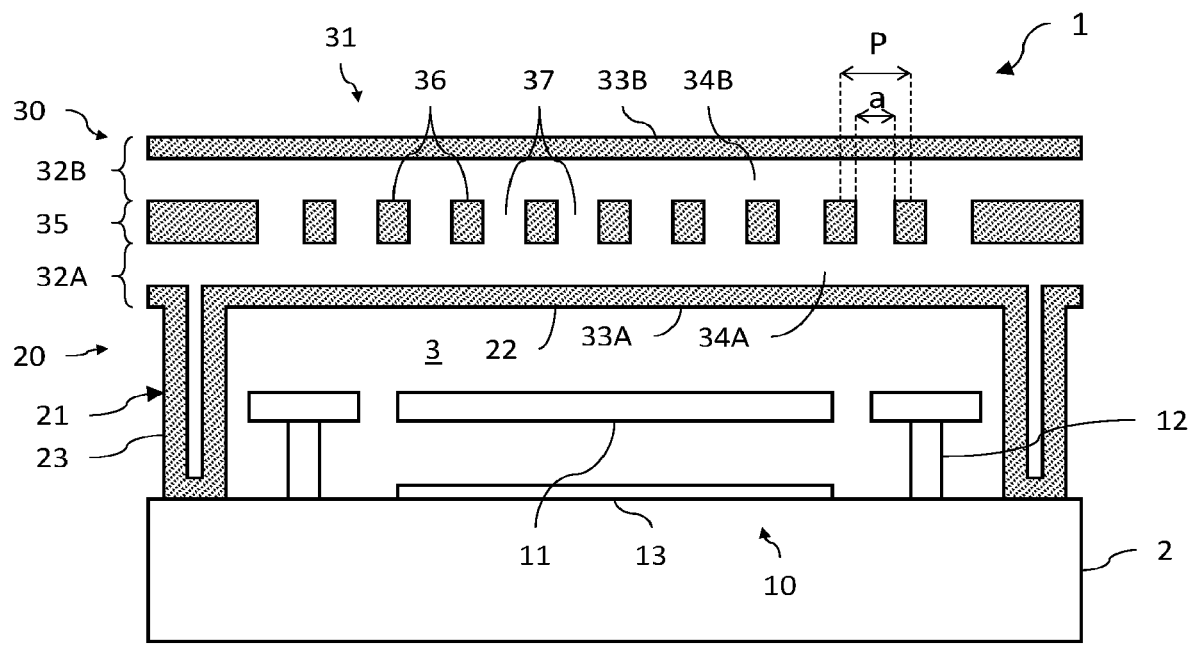
Fig.2A
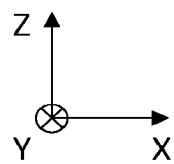

US 10,825,936 B2

DEVICE FOR DETECTING ELECTROMAGNETIC RADIATION HAVING AN ENCAPSULATING STRUCTURE INCLUDING AT LEAST ONE INTERFERENCE FILTER

TECHNICAL FIELD

The field of the invention is that of devices for detecting electromagnetic radiation, in particular infrared or terahertz radiation, including at least one thermal detector encapsulated in a cavity at least partially formed by an encapsulating structure level with which at least one interference filter is located. The invention in particular applies to the field of multispectral detection.

PRIOR ART

Devices for detecting electromagnetic radiation, for example infrared or terahertz radiation, may comprise a matrix array of what are called elementary thermal detectors, each detector including an absorbing section able to absorb the electromagnetic radiation to be detected. In order to thermally insulate the thermal detectors, the absorbing sections conventionally take the form of membranes suspended above the substrate by anchoring pillars, and are thermally insulated from said substrate by thermally insulating holding arms. These anchoring pillars and insulating arms also have an electrical function, as they electrically connect the suspended membranes to a read circuit that is generally placed in the substrate.

With the aim of achieving multispectral detection, i.e. of filtering wavelengths in a detection range of the thermal detector, the detecting device may include interference filters each associated with one thermal detector. In this regard, FIG. 1 illustrates an example of a multispectral detecting device such as that described in document FR2977937. The detecting device 1 includes a matrix array of microbolometers each including an MIM (metal-insulator-metal) filter 5 resting directly on the absorbing membrane 11. Each MIM filter 5 is formed from a stack of two metal layers 5.1, 5.3 that are separated from each other by an insulating layer 5.2, the stack 5 being structured into pads the lateral dimensions of which define the value of the resonant wavelength of the filter. Thus, the detecting device includes a plurality of MIM filters that are different from one another, one of said filters being placed on each of the absorbing membranes, so as to allow simultaneous detection of a plurality of different wavelengths in a spectral detection domain.

However, there is a need for a device for detecting electromagnetic radiation including at least one thermal detector and at least one interference filter, at least some of the properties of the thermal detector of which are not affected by the interference filter.

SUMMARY OF THE INVENTION

The objective of the invention is to at least partially remedy the drawbacks of the prior art, and more particularly to propose a device for detecting electromagnetic radiation including:
 a substrate;
 at least one thermal detector, placed on the substrate;
 an encapsulating structure arranged so as to define with the substrate a cavity housing said thermal detector, including at least one thin encapsulating layer extending above the thermal detector.

According to the invention, it furthermore includes:
 at least one Fabry-Perot interference filter placed level with the encapsulating structure and away from the thermal detector, said filter being formed by first and second semi-reflective mirrors that are separated from each other by a layer called the structured layer;
 each semi-reflective mirror including what is called a high-refractive-index layer made of at least one dielectric or semiconductor material, said layer having a thickness equal to a multiple of the ratio of a reference wavelength comprised in a detection spectral domain of the thermal detector over four times its refractive index;
 the structured layer including an alternation, in a plane parallel to the plane of the substrate, of what are called high-refractive-index sections made from at least one dielectric or semiconductor material, and what are called low-refractive-index sections made from a medium the refractive index of which is lower than that of the material of the high-index sections;
 the high-index layer of one of said semi-reflective mirrors being at least partially formed from said thin encapsulating layer.

The following are certain preferred but nonlimiting aspects of this device for detecting electromagnetic radiation.

Each semi-reflective mirror may include a single high-index layer, and at least one of said semi-reflective mirrors may include what is called a low-index layer made from a medium the refractive index of which is lower than that of the material of the high-index layer, said low-index layer being located between the high-index layer and the structured layer.

The difference between the refractive index of the material of the high-index layer and that of the medium of the low-index layer may be larger than or equal to 1.5.

The medium of the low-index layer and of the low-index sections may be vacuum or a gas.

The high-index layer of at least one of said semi-reflective mirrors may be formed from a stack of at least two sublayers that make contact with one another and that are made from different materials.

The structured layer may have a proportion by volume of high-index sections higher than or equal to 30%.

The structured layer may include a continuous layer on which the high-index sections rest.

The high-index layer of what is called an upper semi-reflective mirror may include what is called an upper wall located facing the structured layer, and what are called lateral walls located on either side of the upper wall, the structured layer being maintained above the high-index layer of what is called a lower semi-reflective mirror by the lateral walls.

The thin encapsulating layer may extend continuously around the thermal detector so as to form an upper wall located above the thermal detector and a lateral wall resting on the substrate.

The detecting device may include:
 a plurality of thermal detectors placed on the substrate, above which detectors said thin encapsulating layer extends;
 a plurality of Fabry-Perot interference filters each placed level with the encapsulating structure;
 the thin encapsulating layer being common to a plurality of high-index layers of one of said semi-reflective mirrors of the various interference filters.

The semi-reflective mirrors and the structured layers of the interference filters may be respectively coplanar from one interference filter to the next.

The invention also relates to a process for producing a detecting device according to any one of the preceding features, including at least the following steps:

a. producing at least one thermal detector;
b. producing an encapsulating structure arranged so as to define with the substrate a cavity housing said thermal detector, including at least one thin encapsulating layer extending above the thermal detector and resting on a sacrificial layer covering said thermal detector;
c. producing at least one Fabry-Perot interference filter, a sacrificial layer being located between the high-index sections of the structured layer, and optionally between a high-index layer and the structured layer;
d. removing said sacrificial layers.

The sacrificial layers may be removed in the same step, subsequently to the step of producing the interference filter, the sacrificial layers being made from the same material, the high-index layers of the two semi-reflective mirrors each including a through-orifice, and the low-index sections of the structured layer being through-sections.

The sacrificial layers may be removed in two substeps:
a first sub-step of removing the sacrificial layer on which the thin encapsulating layer rests, carried out before the step of producing the interference filter, the thin encapsulating layer including a through-orifice, and a sealing layer then being deposited on the thin encapsulating layer so as to block the through-orifice; and
a second sub-step of removing the sacrificial layer located between the high-index sections of the structured layer, the high-index layer of the upper semi-reflective mirror including a through-orifice.

BRIEF DESCRIPTION OF THE DRAWINGS

Other aspects, aims, advantages and features of the invention will become more clearly apparent on reading the following detailed description of preferred embodiments thereof, which description is given by way of nonlimiting example and with reference to the appended drawings, in which:

FIG. 1, which has already been described, is a schematic view of a multispectral detecting device according to an example of the prior art;

FIG. 2A is a schematic cross-sectional view of a device for detecting electromagnetic radiation according to a first embodiment.

DETAILED DESCRIPTION OF PARTICULAR EMBODIMENTS

Figure 2B:
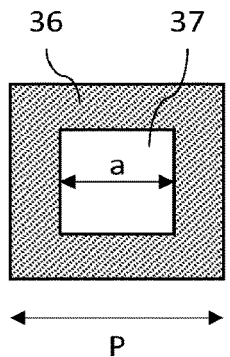
FIG. 2B is a top view of an example of an elementary motif in the structured layer.

In the figures and in the rest of the description, the same references have been used to reference identical or similar elements. In addition, the various elements are not shown to scale for the sake of the clarity of the figures. Moreover, the various embodiments and various variants are not exclusive of one another and may be combined together. Unless otherwise indicated, the terms "substantially", "about" and "of the order of" mean to within 10%.

Generally, the invention relates to a device for detecting electromagnetic radiation including at least one thermal detector located in an advantageously hermetic cavity. Preferably, the detecting device includes a matrix array of thermal detectors that are located, alone or in a number of two or more, in one or more cavities.

In the rest of the description, the thermal detectors are bolometers the absorbing membrane of which is suspended above the substrate. The membrane includes a thermistor material the electrical conductivity of which varies as a function of the temperature of the membrane. However, this example is given by way of illustration and is in no way limiting. Any other type of thermal detector may be used, for example pyroelectric detectors, ferroelectric detectors, or even thermopiles.

The detecting device includes an encapsulating structure that defines, with the substrate, the cavity in which one or more thermal detectors are located. The encapsulating structure includes a thin encapsulating layer that extends above the one or more thermal detectors, and more precisely above the one or more absorbing membranes. It is made from a material that is transparent to the radiation to be detected, and has a thickness of the order of a few hundred nanometres to a few microns. As detailed below, the thin encapsulating layer may extend around the one or more thermal detectors, i.e. it may define the peripheral border of the cavity. It may furthermore extend continuously above a plurality of thermal detectors. By thin layer, what is meant is a layer deposited by the material deposition techniques used in microelectronics, and the thickness of which is preferably smaller than 10 µm.

The detecting device furthermore includes a Fabry-Perot interference filter. Such a filter is formed from two semi-reflective mirrors that are separated from each other by what is called a structured layer, of thickness d and of average refractive index $n_{cs}$. A semi-reflective mirror is said to be lower when it is located on the side of the structured layer oriented towards the thermal detector, or is said to be higher when it is located on the opposite side of the structured layer. The interference filter reflects wavelengths of the incident light in the detection range of the thermal detector, except at one or more wavelengths that are transmitted. The central wavelength of the transmission peak of the spectral response of the filter in particular depends on the optical thickness $n_{cs}$.d of the structured layer.

Thus, the interference filter allows the detecting device to detect electromagnetic radiation selectively, this being achieved by filtering wavelengths of the incident radiation that lie within what is called a detection spectral domain, i.e. a spectral domain able to be detected by the thermal detector. The detection spectral domain is, in the rest of the description, the LWIR infrared band (wavelengths comprised between 8 µm to 14 µm) but the detecting device may be used in other infrared spectral domains in which the thermal detectors are sensitive, such as the THz, MWIR (between 3 µm and 5 µm) or the SWIR (between 1 µm and 3 µm) ranges. With the aim of simplifying the processing of the detected signals, it is desired here that the interference filters be narrow-band passband filters, with a high transmission inside the passband and a high rejection of wavelengths outside thereof.

As is described in detail below, each semi-reflective mirror includes at least one what is called high-index layer made from at least one dielectric or semiconductor material, and advantageously one what is called low-index layer made from a medium the refractive index of which, or optical index of which, is lower than that of the material of the high-index layer. Preferably, each semi-reflective mirror includes only a single high-index layer that is advantageously separated from the structured layer by a low-index layer. The high-index layer may be made from one given material, or from a stack of sublayers of different materials. The high-index layer has a thickness equal to a multiple of the ratio of a reference wavelength comprised in a spectral detection range of the thermal detector over four times its refractive index. The thickness is here defined as the average dimension of the high-index layer located facing the thermal detector, in a direction orthogonal to the plane of the substrate. The reference wavelength is a predefined wavelength comprised in the spectral detection domain. For example, the reference wavelength may be equal to 10 µm for the LWIR. The high-index layer thus has an optical function, as it forms a quarter-wave or half-wave plate at the reference wavelength. The refractive index of the high-index layer is that of its dielectric or semiconductor material, or the average refractive index when it contains a plurality of different materials.

The structured layer has a substantially constant thickness, and is formed from an alternation, in a plane parallel to the semi-reflective mirrors, of what are called high-index sections made from at least one dielectric or semiconductor material, and what are called low-index sections made from a medium the refractive index of which is lower than that of the material of the high-index sections and of the material of the high-index layers. The proportion by volume of high-index sections to the total volume of the structured layer, in a zone located facing, i.e. perpendicular to, the absorbing membrane, is equivalent to a fill factor of the structured layer. Thus, a fill factor of 1 corresponds to a continuous layer made from the material of the high-index section. The average refractive index $n_{cs}$ of the structured layer may be defined on the basis of the refractive indices of the material of the high-index sections and of the medium of the low-index sections, weighted by the fill factor. The lateral dimensions of the high-index and low-index sections, in the main plane (X, Y) of the filter, participate in the definition of the central wavelength of the transmission peak of the spectral response of the interference filter.

According to the invention, the high-index layer of one of the semi-reflective mirrors of the interference filter, and preferably the lower semi-reflective mirror, is at least partially formed from the thin encapsulating layer. In other words, as described below, the high-index layer may include only the thin encapsulating layer, and therefore consist thereof, or be formed from a stack of a plurality of sublayers one of which corresponds to the thin encapsulating layer. Thus, the interference filter does not rest on the absorbing membrane, in the sense that it does not make contact with the membrane. Thus, the properties of the absorbing membrane are preserved from any degradation relating to possible contact of the filter with the absorbing membrane. In addition, the thin encapsulating layer furthermore has an optical function insofar as its thickness participates in the formation of a quarter-wave or half-wave plate of the high-index layer.

The detecting device may advantageously be used for multi-spectral detection. In this respect, the detecting device includes a matrix array of thermal detectors suitable for detecting electromagnetic radiation located in a given spectral detection domain defined by the properties of the absorbing membranes. A matrix array of interference filters is placed facing the detecting matrix, one interference filter being placed facing each detector. The thin encapsulating layer is advantageously common to the one or more cavities that house the matrix array of detectors, and hence the same thin encapsulating layer extends above each thermal detector. It forms the high-index layer, or one of the sublayers, of one of the semi-reflective mirrors of each interference filter. Preferably, the semi-reflective mirrors and the structured layer of the various interference filters are respectively coplanar. In other words, the structured layers of the various filters are preferably coplanar, the upper mirrors are preferably coplanar, and the lower mirrors are preferably coplanar. The interference filters differ from one another essentially in the lateral dimensions of the high- and low-index sections of the structured layers, and therefore in their fill factor, which define the central wavelength of the spectral responses of each interference filter.

FIG. 2A is a schematic cross-sectional view of a device for detecting electromagnetic radiation according to a first embodiment.

Here, and for the rest of the description, a three-dimensional orthonormal coordinate system (X, Y, Z) is defined in which the (X, Y) plane is substantially parallel to the plane of a substrate of the detecting device 1, the Z-axis being oriented in a direction substantially orthogonal to the plane of the substrate 2. Thus, the terms "vertical" and "vertically" are understood as being relative to an orientation along the Z-axis, and the terms "lower" and "upper" are understood as being relative to positions in order of increasing distance from the substrate 2 along the Z-axis.

The device for detecting electromagnetic radiation is suitable for detecting infrared or terahertz radiation. It includes at least one thermal detector, and preferably a matrix array of thermal detectors that are electrically connected to a read circuit. FIG. 2 is a partial view of the detecting device 1 and shows only a single thermal detector.

The detecting device 1 comprises a silicon-based substrate 2 comprising an electronic readout circuit (not shown) produced in CMOS technology, allowing a control signal to be applied to the thermal detectors and the detection signals generated thereby in response to the detection of the electromagnetic radiation of interest to be read. The readout circuit may include a lower portion formed from MOS-type electronic devices, for example transistors, diodes, capacitors, etc., that are suitable for implementing various electronic functions of the readout circuit. It furthermore includes a plurality of electrical interconnect levels electrically connecting the various MOS devices and the thermal detectors, and electrically connecting the readout circuit to at least one electrical pad enabling connection with the exterior of the detecting device.

On the substrate 2 rests a microbolometer 10 that includes a membrane 11 suitable for absorbing the radiation to be detected in the spectral detection domain. The absorbing membrane 11 is thermally insulated from and suspended above the substrate 2, by holding and thermally insulating elements such as anchoring pillars 12 associated with thermally insulating arms (not shown). The absorbing membrane 11 is spaced apart from the substrate 2 by a distance typically comprised between 1 µm and 5 µm, preferably 2 µm when the detectors are designed to detect infrared radiation comprised in the LWIR A reflector 13 is located on the substrate 2, and placed facing the absorbing membrane 11.

The detecting device 1 includes an encapsulating structure 20, or capsule, that defines, with the substrate 2, an advantageously hermetic cavity 3 inside of which is located the thermal detector 10. The encapsulating structure 20 is formed from a thin encapsulating layer 21 deposited so that it includes a substantially planar upper wall 22 that extends above the detector 10, at a nonzero distance from the suspended membrane 11, for example a distance comprised between 0.5 µm and 5 µm, preferably 1.5 µm. It furthermore includes an optionally peripheral lateral wall 23, so as to encircle the thermal detector in the (X, Y) plane, which extends from the upper wall 22 and rests on the substrate 2. The thin encapsulating layer 21 therefore extends, in this example, continuously above and around the thermal detector so as to define the cavity 3 with the substrate 2. As detailed below, in the case where the thin encapsulating layer 21 includes a through-orifice forming an exhaust vent, the encapsulating structure 20 may include at least one sealing layer covering the thin encapsulating layer 21 so as to block the vent, so as to thus ensure the hermeticity of the cavity. Thus, the encapsulating structure defines a cavity that houses the one or more thermal detectors.

The detecting device includes an optical filtering structure 30 including at least one Fabry-Perot interference filter 31. The interference filter 31 is located facing the thermal detector 10, and more precisely facing the absorbing membrane 11, level with the encapsulating structure 20, and therefore does not make contact with the absorbing membrane 11. The interference filter 31 is able to transmit a single spectral band, comprised in the detection spectral domain. In the case of a matrix array of thermal detectors, the optical filtering device 30 includes a plurality of Fabry-Perot interference filters 31 placed facing thermal detectors, for example with one filter 31 being placed facing each detector 10. The filters 31 are then structured so that the central wavelengths of the spectral responses are different with respect to one another.

The interference filter 31 includes a stack of layers forming a lower semi-reflective mirror 32A and an upper semi-reflective mirror 32B, separated from each other by a structured layer 35. Each semi-reflective mirror 32A, 32B includes at least one what is called high-refractive-index layer, and may include, as illustrated in FIG. 2, what is called a low-refractive-index layer, located between the high-index layer and the structured layer. Preferably, at least one semi-reflective mirror includes such a low-index layer, so that the spectral response of the interference filter has a sufficiently thin transmission peak and a good rejection ratio.

The high-index layers 33A, 33B are made from at least one dielectric or semiconductor material that may be chosen from silicon, germanium, a silicon germanium alloy $Si_xGe_{1-x}$, and silicon carbide $Si_xC_{1-x}$, which may for example be amorphous. Their thicknesses are such that each high-index layer 33A, 33B advantageously forms a quarter-wave plate with respect to a reference wavelength comprised in the detection spectral domain, 10 µm for example. By way of example, for a detection spectral domain corresponding to the LWIR, the thickness of the high-index layers 33A, 33B may be about 0.73 µm for amorphous silicon with an optical index of 3.5. As detailed below, each high-index layer 33A, 33B may be formed from a stack of a plurality of sublayers of various materials making contact with one another. The materials are chosen so that the stack of sublayers is optically equivalent, in terms of optical path, to a single high-index layer, the mean refractive index then depending on the refractive indices specific to each material of the sublayers.

Each semi-reflective mirror 32A, 32B here includes a low-index layer 34A, 34B made from a medium having a refractive index lower than that of the high-index layer 33A, 33B, with a contrast in index preferably higher than 1.5. This medium may be chosen from a dielectric or semiconductor material, a gas or vacuum. In the case of a gas or vacuum, the low-index layer 34A, 34B then corresponds to a gas- or vacuum-filled zone between the structured layer 35 and the high-index layer 33A, 33B, of substantially constant thickness. The thickness of the low-index layers 34A, 34B is such that each layer 34A, 34B advantageously forms a quarter-wave plate with respect to the reference wavelength. By way of example, for the detection spectral domain corresponding to the LWIR, the thickness of the low-index layers may be about 2.5 µm for air.

A high contrast in index, preferably higher than or equal to 1.5, between the refractive indices of the high-index layer 33A, 33B and the low-index layer 34A, 34B allows a thin transmission peak to be obtained centred on a central wavelength, while pushing orders higher than the first order of the Fabry-Perot cavity outside of the detection spectral domain.

Between the two semi-reflective mirrors 32A, 32B extends a structured layer 35, forming the spacer of the Fabry-Perot cavity. It includes what are called high-index sections 36 made from at least one dielectric or semiconductor material, and low-index sections 37 made from a medium of refractive index lower than that of the material of the high-index sections. The high-index sections 36 and the low-index sections 37 alternate in the (X, Y) plane of the filter, i.e. in a plane parallel to the planes of the semi-reflective mirrors. They are arranged so as to form a motif, or design, that is possibly repeated periodically or not. Thus, each section of a first medium is located between two sections of the second medium in the (X, Y) plane of the filter, so that the sections 36, 37 are mutually arranged so as to alternate. It is therefore not a question of a superposition of layers of two different media along the Z-axis.

The material of the high-index sections 36 may be a dielectric or semiconductor material, and is preferably identical to that of the high-index layers of the semi-reflective mirrors. It may thus be a question of silicon, for example amorphous silicon, or germanium. The medium of the low-index sections is preferably a gas or a vacuum, but may be a dielectric or semiconductor material. The difference between the refractive index of the high-index material and that of the low-index medium is preferably larger than or equal to 1.5. Thus, the interference filter includes no metal materials liable to affect the detection of the infrared or terahertz radiation.

The structured layer 35 has a substantially constant thickness, and hence the high-index sections 36 and the low-index sections 37 have substantially the same thickness. The thickness may be of the order of 2 µm, in order to limit unwanted resonances in the operating range of the multispectral detecting device.

The high-index sections 36 and the low-index sections 37 are mutually arranged so as to form an elementary motif, that optionally repeats periodically along one or two axes in the (X, Y) plane. The motifs may be periodic in two dimensions, and may take the form of any type of arrangement of pads that may be square or circular, inter alia. They are then suitable for filtering unpolarized light or light having two polarizations. The motifs may as a variant be periodic in only one dimension, and then take the form of slits. They are then suitable for filtering light having a single polarization.

The central wavelength of the transmission peak of the spectral response of the interference filter 31 in particular depends on the dimensional parameters of the structured layer 35, namely the lateral dimensions of the high-index and low-index sections 36 and 37, the period of the arrangement of the motifs, and the value of the refractive indices of these media. The dimensions of the motifs of the structured layer 35, in terms of period and lateral dimensions, in the main plane (X, Y) of the structured layer 35, may be smaller than a value of a central wavelength of the transmission peak of the first order spectral response of the filter.

The thin encapsulating layer 21 of the encapsulating structure 20 here forms the high-index layer 33A of one of said semi-reflective mirrors, here the lower semi-reflective mirror 32A. The interference filter 31 does not then rest directly on the absorbing membrane 11 but is spaced apart therefrom. The presence of the filter 31 does not therefore affect the performance of the thermal detector, in particular the response time of the detector, which in particular depends on the thermal inertia of the absorbing membrane, the latter being degraded when the interference filter rests directly on the membrane, as in the example of the prior art described above.

It is advantageous for one or both of the semi-reflective mirrors 32A, 32B to include only a single high-index layer 33A, 33B and not a plurality of high-index layer in alternation with low-index layers as is conventionally the case with multilayer dielectric mirrors. Specifically, as will be described below, the producing process is simplified while interference filters having a high spectral selectivity and a high rejection ratio are nonetheless obtained.

Figure 2C:
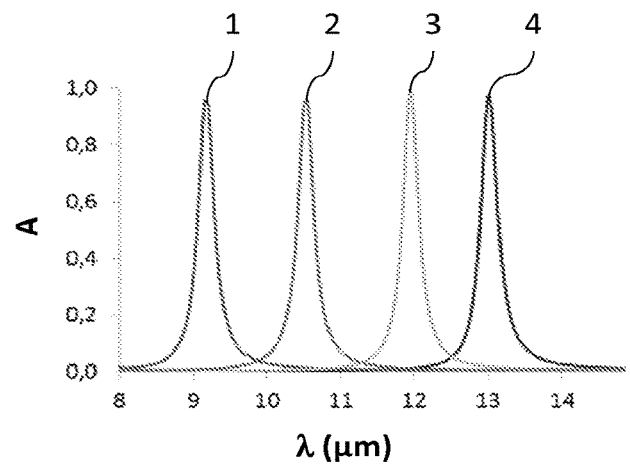
FIG. 2C illustrates the spectral response of such a detecting device for various values of the fill factor of the structured layer.

FIG. 2B is a top view of an example of an elementary motif formed by a high-index section and by a low-index section of the structured layer, and FIG. 2C illustrates the spectral responses of the filter for various values of the fill factor of the structured layer.

As mentioned above, the fill factor f is defined as the ratio of the volume occupied by the high-index sections 36 to the total volume of the structured layer 35, in particular in a zone of the structured layer located facing, i.e. perpendicular to, the absorbing membrane. Moreover, the spectral response is here characterized by the value of the transmission coefficient of the filter as a function of the wavelength of the incident radiation, by the fullwidth at half-maximum of the transmission peak, and by the rejection ratio, in the corresponding detection spectral domain, here the LWIR (8-14 µm). The rejection ratio is defined here as the ratio of the maximum transmittance value in the passband of the filter to the minimum transmittance value outside of the passband, in the detection spectral domain in question.

In the example in FIG. 2B, the elementary motif formed by the high-index sections 36 and the low-index sections 37 of the structured layer 35 takes the form of a through-orifice of square cross section in the (X, Y) plane of side "a", surrounded by a high-index section 36. The structured layer 35 thus takes the form of a grid made from the material of the high-index sections, in which grid the through-orifices form the low-index sections 37, the latter being spaced apart from each other by a period P. As mentioned above, the through-orifice may be various shapes in cross section in the (X, Y) plane.

Each semi-reflective mirror 32A, 32B includes a high-index layer 33A, 33B made of amorphous silicon of a thickness of about 0.8 µm and a low-index layer 34A, 34B of vacuum of a thickness of 2.5 µm, forming together a quarter-wave plate for a reference wavelength of 10 µm. The structured layer 35 has a thickness of about 1.9 µm and is formed from high-index sections 36 made of amorphous silicon and low-index sections 37 of vacuum. FIG. 2C illustrates the spectral response of the interference filter for various values of the lateral dimension "a" of the low-index sections 37, and the table below indicates the corresponding value of the central wavelength of the transmission peak.

| Ref | 1 | 2 | 3 | 4 |
| --- | --- | --- | --- | --- |
| P (µm) | 2 | 2 | 2 | 2 |
| a (µm) | 1.5 | 1.2 | 0.75 | 0 |
| $\lambda_c$ (µm) | 9 | 10.5 | 12 | 13 |

In the detection spectral domain corresponding to the LWIR, each spectral response here has a thin transmission peak with a high rejection ratio outside of the passband of the filter.

Figure 3A:
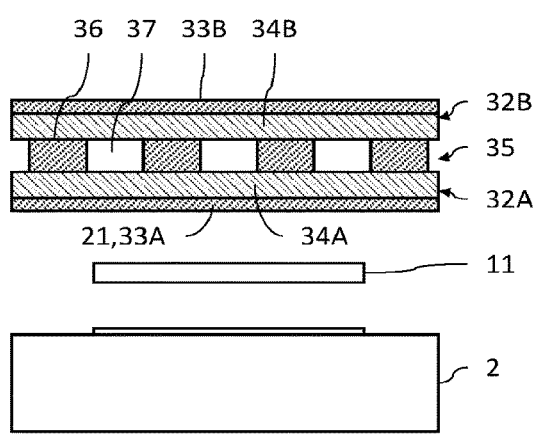
FIG. 3A is a schematic view of a first interference filter variant.
Figure 3B:
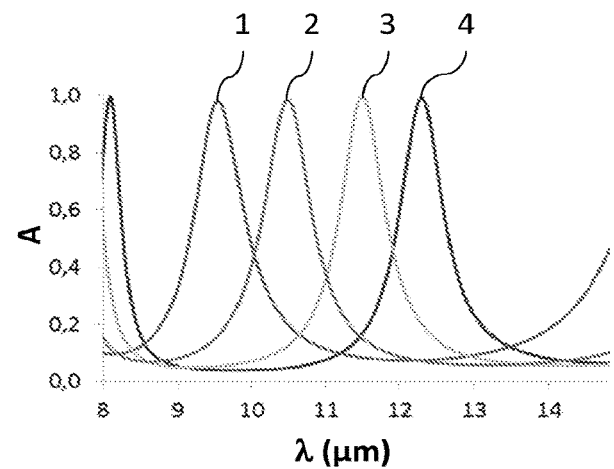
FIG. 3B illustrates the spectral response of such a detecting device for various values of the fill factor of the structured layer.

FIGS. 3A and 3B illustrate a detecting device including an interference filter according to a first variant of the first embodiment, and the spectral responses associated with various values of the fill factor of the structured layer, respectively.

In this example, the interference filter 31 differs from that illustrated in FIG. 2A essentially in that each semi-reflective mirror 32A, 32B includes a low-index layer 34A, 34B made from a dielectric or semiconductor material other than air or vacuum. The contrast in index of each semi-reflective mirror, between the high- and low-index layers, is thus decreased with respect to that of the mirrors of FIG. 2A. Thus, by way of illustration, the low-index layers 34A, 34B may be formed from zinc sulphide ZnS the refractive index of which is 2.2 in the detection spectral domain 8-14 µm. For a given period P of the motifs and various values of the width "a" of the low-index sections, filters are obtained the value of the central wavelength of which is indicated in the table below.

| Ref | 1 | 2 | 3 | 4 |
|---|---|---|---|---|
| P (μm) | 2 | 2 | 2 | 2 |
| a (μm) | 1.5 | 1.2 | 0.75 | 0 |
| $\lambda_c$ (μm) | 9.5 | 10.5 | 11.5 | 12.5 |

The transmission peaks widen and the rejection ratio degrades, in particular because of the presence of secondary transmission peaks, in particular caused by orders of the Fabry-Perot cavities higher than the first order. With the aim of maintaining a spectral response that is correct, in terms of transmission-peak width and rejection ratio, the contrast in index between the high- and low-index layers of the semi-reflective mirrors is advantageously higher than or equal to 1.5, and preferably chosen to be as high as possible.

Figure 4A:
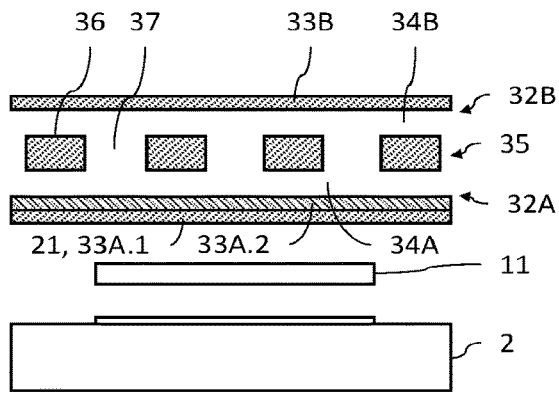
FIG. 4A is a schematic view of a second interference filter variant.
Figure 4B:
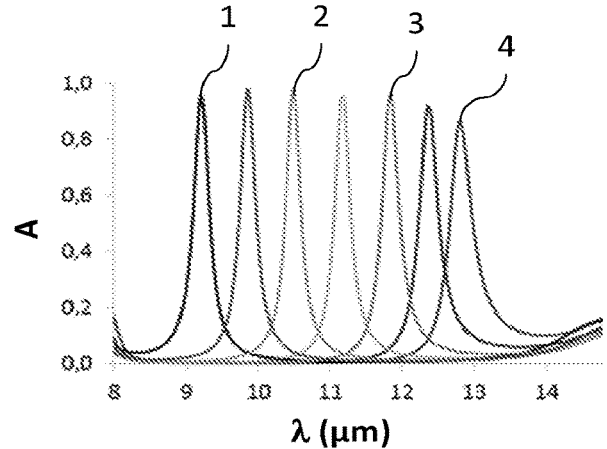
FIG. 4B illustrates the spectral response of such a detecting device for various values of the fill factor of the structured layer.

FIGS. 4A and 4B illustrate a detecting device including an interference filter according to a second variant of the first embodiment, and the spectral responses associated with various values of the fill factor of the structured layer, respectively.

In this example, the interference filter 31 differs from that illustrated in FIG. 2A essentially in that the high-index layer of the lower semi-reflective mirror 32A is formed from a stack, along the Z-axis, of at least two sublayers 33A.1, 33A.2 made of different materials, these materials being dielectrics or semiconductors and having an optical index higher than that of the medium of the low-index layers 34A, 34B and of the medium of the low-index sections 37 of the structured layer. The second sublayer 33A.2 covers and makes contact with the first sublayer 33A.1, the latter here being the thin encapsulating layer 21. The high-index layer formed from a plurality of high-index materials is then optically equivalent to a single high-index layer. The thickness of the high-index layer is advantageously such that it forms a three-quarter-wave layer. Thus, the filter has a selective spectral response and a high rejection ratio.

By way of illustration, the lower high-index layer is formed from a sublayer 33A.1 of amorphous silicon of about 0.73 μm thickness, covered with a sublayer 33A.2 of germanium of about 1.25 μm thickness, and the upper high-index layer 33B is made of amorphous silicon of about 0.73 μm thickness, the high-index layers being separated from the structured layer 35 by low-index layers 34A, 34B of air of about 2.5 μm thickness. For a given period P of the motifs and various values of the width a of the low-index sections, filters are obtained the value of the central wavelength of which is indicated in the table below.

| Ref | 1 | 2 | 3 | 4 |
|---|---|---|---|---|
| P (μm) | 2 | 2 | 2 | 2 |
| a (μm) | 1.5 | 1.2 | 0.75 | 0 |
| $\lambda_c$ (μm) | 9 | 10.5 | 12 | 13 |

With respect to the spectral responses illustrated in FIG. 2C, the transmission peaks remain thin and the rejection ratio is high. Only the transmission level decreases slightly when the width a of the low-index sections is close or equal to 0 (fill factor close or equal to 1).

Figure 5A:
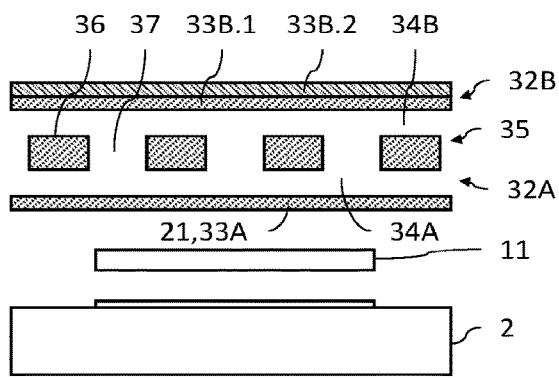
FIG. 5A is a schematic view of a third interference filter variant.
Figure 5B:
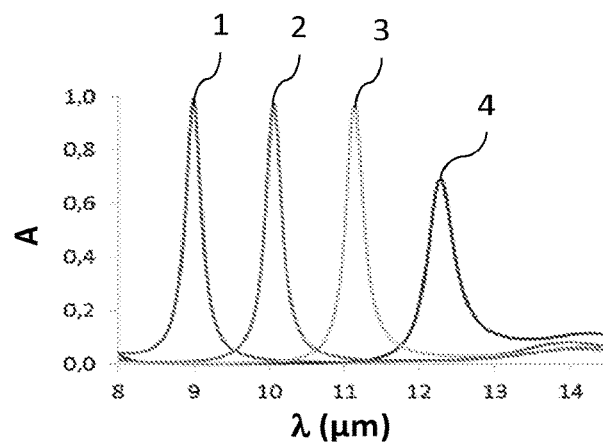
FIG. 5B illustrates the spectral response of such a detecting device for various values of the fill factor of the structured layer.

FIGS. 5A and 5B illustrate a detecting device including an interference filter according to a third variant of the first embodiment, and the spectral responses associated with various values of the fill factor of the structured layer, respectively.

In this example, the interference filter 31 differs from that illustrated in FIG. 4A essentially in that only the high-index layer of the upper semi-reflective mirror 32B, and no longer the lower mirror 32A, is formed from a stack, along the Z-axis, of at least two sublayers 33B.1, 33B.2 made of different materials, these materials being dielectrics or semiconductors and having an optical index higher than that of the medium of the low-index layer 34B and of the medium of the low-index sections 37 of the structured layer. The thin encapsulating layer 21 here forms the single high-index layer 33A of the lower mirror 32A. Thus, by way of illustration, the upper high-index layer is formed from a sublayer 33B.1 of amorphous silicon of about 0.73 μm thickness covered with a sublayer 33B.2 of germanium of about 1.25 μm thickness, and the lower high-index layer 33A is made of amorphous silicon of about 0.73 μm thickness, the high-index layers being separated from the structured layer 35 by low-index layers 34A, 34B of air of 2.5 μm thickness. For a given period P of the motifs and various values of the width a of the low-index sections, filters are obtained the value of the central wavelength of which is indicated in the table below.

| Ref | 1 | 2 | 3 | 4 |
|---|---|---|---|---|
| P (μm) | 2 | 2 | 2 | 2 |
| a (μm) | 1.5 | 1.2 | 0.75 | 0 |
| $\lambda_c$ (μm) | 9 | 10.5 | 12 | 13 |

With respect to the spectral responses illustrated in FIG. 4B, the transmission peaks remain thin and the rejection ratio is high. When the width a of the low-index sections is close or equal to 0 (fill factor close or equal to 1), the transmission peak has a decreased maximum value and an increased fullwidth at half-maximum.

Figure 6A:
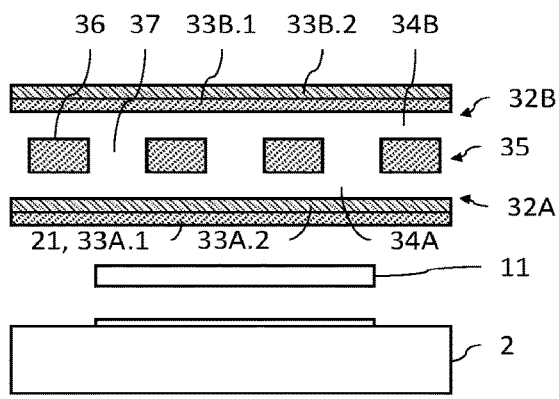
FIG. 6A is a schematic view of a fourth interference filter variant.
Figure 6B:
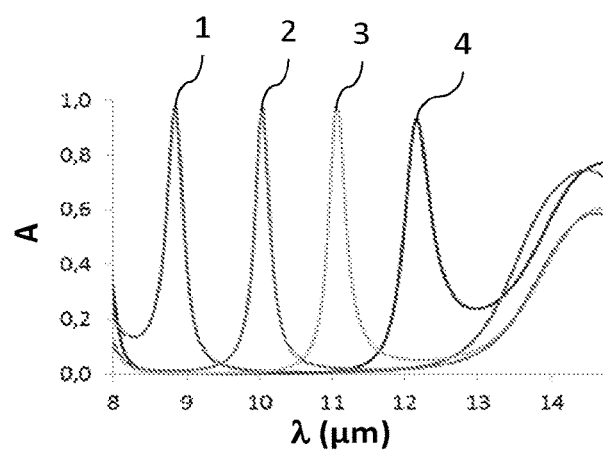
FIG. 6B illustrates the spectral response of such a detecting device for various values of the fill factor of the structured layer.

FIGS. 6A and 6B illustrate a detecting device including an interference filter according to a fourth variant of the first embodiment, and the spectral responses associated with various values of the fill factor of the structured layer, respectively.

In this example, the interference filter 31 differs from those illustrated in FIGS. 4A and 5A essentially in that the high-index layers of the lower and upper semi-reflective mirrors 32A and 32B are both formed from a stack, along the Z-axis, of at least two sublayers made of different materials, these materials being dielectrics or semiconductors and having an optical index higher than that of the medium of the optional low-index layer and of the medium of the low-index sections of the structured layer. The thin encapsulating layer 21 forms the first high-index sublayer 33A.1 of the lower mirror 32A. Thus, by way of illustration, the high-index layers of the semi-reflective mirrors 32A, 32B are each formed from a first sublayer 33A.1, 33B.1 made of amorphous silicon of about 0.73 μm thickness covered with a second sublayer 33A.2, 33B.2 of germanium of about 1.25 μm thickness. They are separated from the structured layer 35 by low-index layers 34A, 34B of air of 2.5 μm thickness. For a given period P of the motifs and various values of the width a of the low-index sections, filters are obtained the value of the central wavelength of which is indicated in the table below.

| Ref | 1 | 2 | 3 | 4 |
|---|---|---|---|---|
| P (μm) | 2 | 2 | 2 | 2 |
| a (μm) | 1.6 | 1.3 | 1 | 0.5 |
| $\lambda_c$ (μm) | 9 | 10 | 11 | 12 |

With respect to the spectral responses illustrated in FIGS. 4B and 5B, the transmission peaks remain thin but the rejection ratio decreases, in particular because of the presence of inflections that appear at the limits of the detection spectral domain 8-14 μm.

Generally, it is advantageous for the high-index layers and the low-index layers to have a thickness such that they form a quarter-wave plate or an uneven multiple of a quarter-wave plate. Thus a single transmission peak is obtained in the detection spectral domain, the value of the central detection wavelength of which may be adjusted by adjusting the lateral dimensions of the structured layer.

One or both of the high-index layers may also have a thickness such that they form a half-wave plate or an even multiple of a half-wave plate. Thus, a transmission peak or a wide transmission band is obtained in the detection spectral domain, depending on the lateral dimensions of the high- and low-index sections of the structured layer. A transmission peak here has a fullwidth at half-maximum smaller than or equal to about one micron, whereas a wide transmission band has a fullwidth at half-maximum larger than one micron, for example equal to 2 or even 3 microns.

One or both of the low-index layers may also have a thickness such that they form a half-wave plate or an even multiple of a half-wave plate. Thus a plurality of transmission peaks that are separate in the detection spectral domain are obtained, with a high rejection ratio.

Figure 7A:
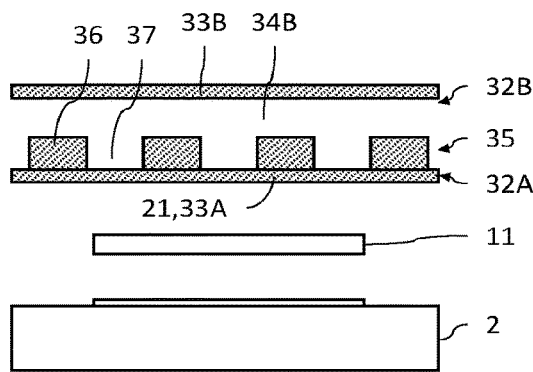
FIG. 7A is a schematic view of a fifth interference filter variant.
Figure 7B:
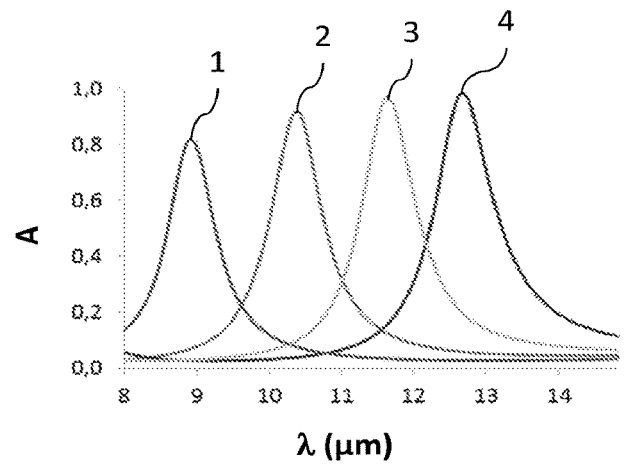
FIG. 7B illustrates the spectral response of such a detecting device for various values of the fill factor of the structured layer.

FIGS. 7A and 7B illustrate a detecting device including an interference filter according to a fifth variant of the first embodiment, and the spectral responses associated with various values of the fill factor of the structured layer, respectively.

In this example, the interference filter 31 differs from that illustrated in FIG. 2A essentially in that the high-index sections 36 of the structured layer 35 rest on the high-index layer 33A of the lower semi-reflective mirror 32A. The lower semi-reflective mirror 32A then includes no low-index layer, and the upper semi-reflective mirror 32B includes a low-index layer 34B.

Thus, by way of illustration, the lower semi-reflective mirror 32A is formed from a single high-index layer 33A made of amorphous silicon of 0.8 μm thickness, on which layer the structured layer 35 formed from the high-index sections 36 made of amorphous silicon and low-index sections 37 of air rests, said sections making contact with the high-index layer 33A. The upper mirror 32B is formed from the low-index layer 34B of air and the high-index layer 33B made of amorphous silicon. The thickness of the upper mirror 32B may be decreased, so that the high-index layer 33B is here 0.45 μm thick and the low-index layer 34B 1.70 μm thick. The structured layer 35 here has a thickness of 1.27 μm. For a given period P of the motifs and various values of the width a of the low-index sections, filters are obtained the value of the central wavelength of which is indicated in the table below. In this example, the configuration P=2 μm and a=1.3 μm differs from the other configurations in so far as the structured layer 35 takes the form of high-index pads 36 of square cross section of lateral dimension "a", space periodically from the other sections 36 by a pitch P.

| Ref | 1 | 2 | 3 | 4 |
|---|---|---|---|---|
| P (μm) | 2 | 2 | 2 | 2 |
| a (μm) | 1.3 | 1.5 | 1.2 | 0.75 |
| $\lambda_c$ (μm) | 9 | 10.5 | 12 | 13 |

The spectral responses have widened transmission peaks with a transmission level comprised between about 0.8 and 1, which decreases for the shortest wavelengths. In this example, the distance between the reflector and the absorbing membrane 11 has been decreased from 1.8 μm to about 1 μm here, thereby allowing the width of the transmission band to be decreased and the transmission level to be increased by an amount ranging up to 25%.

When a semi-reflective mirror includes no low-index layer and the structured layer makes contact with the high-index layer, it is advantageous, in terms of spectral response quality, for this mirror to be the lower mirror and not the upper mirror. Moreover, as a variant (not shown), the lower mirror may include a low-index layer separating the high-index layer from the structured layer, and the upper mirror may include no low-index layer, so that the structured layer then makes contact with the high-index layer of the upper mirror.

Figure 8A:
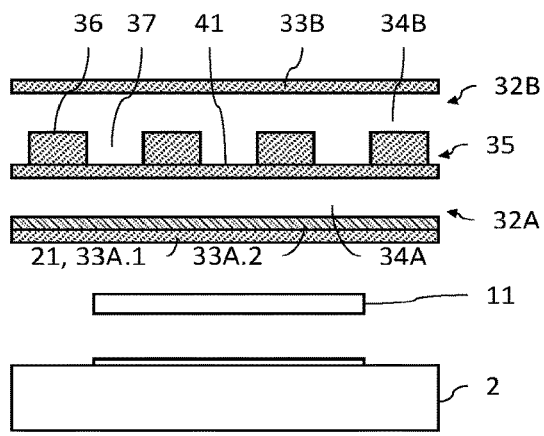
FIG. 8A is a schematic view of a sixth interference filter variant.
Figure 8B:
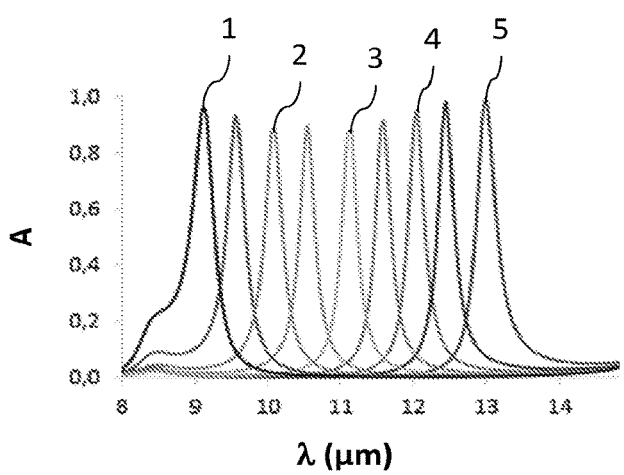
FIG. 8B illustrates the spectral response of such a detecting device for various values of the fill factor of the structured layer.

FIGS. 8A and 8B illustrate a detecting device including an interference filter according to a sixth variant of the first embodiment, and the spectral responses associated with various values of the fill factor of the structured layer, respectively.

In this example, the lower semi-reflective mirror 32A includes a high-index layer formed from two sublayers made of materials that are different from each other, here a sublayer 33A.1 of amorphous silicon of 0.73 μm thickness covered by a second sublayer 33A.2 of germanium of 1.45 μm thickness, and a low-index layer 34A of air of 2.37 μm thickness. The structured layer 35 includes an alternation of high-index sections 36 of amorphous silicon, of about 1.36 μm thickness, and of low-index sections 37 of air, the low-index sections not being through-sections so that the high-index sections 36 rest on a continuous high-index layer 41, here of amorphous silicon of 0.73 μm thickness. Lastly, the upper mirror 32B includes a high-index layer 33B made of a single material, here amorphous silicon of 0.73 μm thickness and a low-index layer 34B, here of air of 2.37 μm thickness. For a given period P of the motifs and various values of the width a of the low-index sections, filters are obtained the value of the central wavelength of which is indicated in the table below. In this example the configurations P=2 μm, a=1.2 μm (f=0.36), and P=2 μm, a=1.5 μm (f=0.56) differ from the other configurations in so far as the structured layer takes the form of high-index pads of square cross section of lateral dimension "a", spaced periodically from the other sections by a pitch P.

| Ref | 1 | 2 | 3 | 4 | 5 |
|---|---|---|---|---|---|
| P (μm) | 2 | 2 | 2 | 2 | 2 |
| a (μm) | 1.2 | 1.5 | 1.35 | 1 | 0 |
| $\lambda_c$ (μm) | 9 | 10 | 11 | 12 | 13 |

This configuration is advantageous in so far as each transmission peak is thin and the transmission level and the rejection quality are both high.

Figure 9:
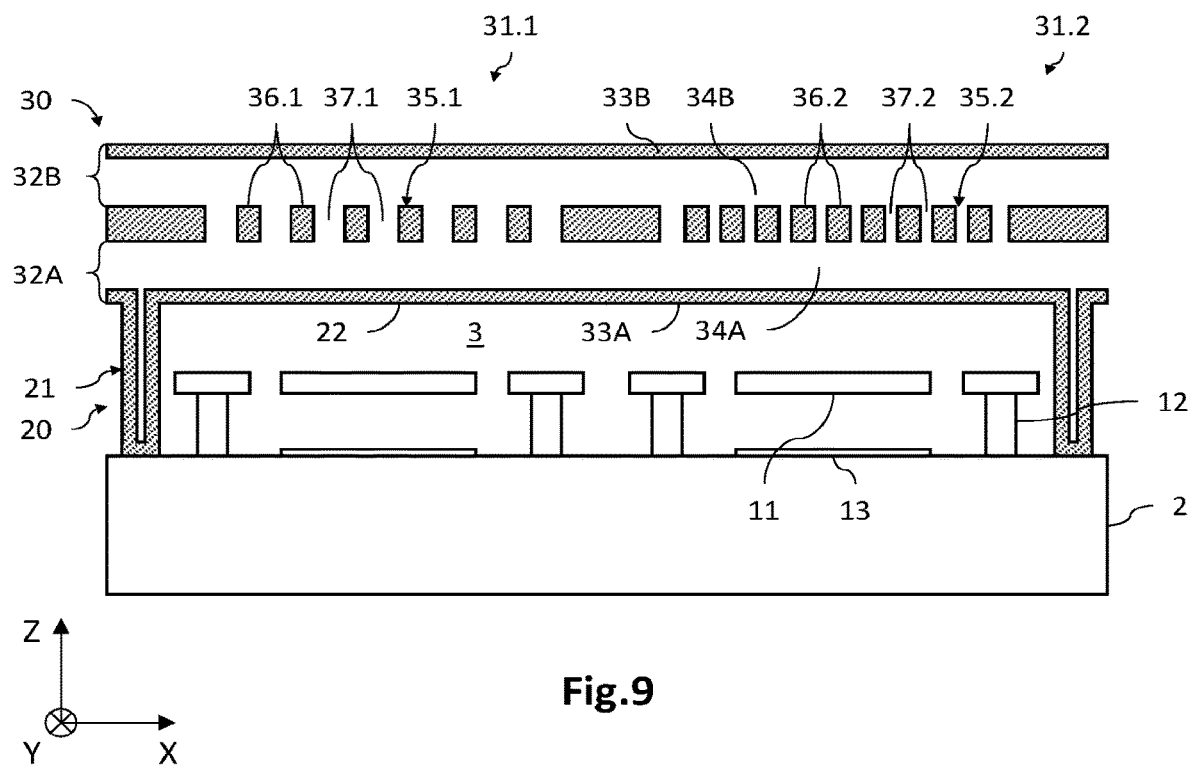
FIG. 9 is a schematic cross-sectional view of a device for detecting electromagnetic radiation according to a second embodiment, suitable for multispectral detection.

FIG. 9 is a schematic cross-sectional view of a multispectral detecting device including a matrix array of thermal detectors located alone or in a number of two or more in a hermetic cavity, and a matrix array of Fabry-Perot interference filters each of which is arranged facing one thermal detector. The thermal detectors are designed to operate in the same detection spectral domain, here the LWIR. Furthermore, the various absorbing membranes have substantially identical optoelectronic properties.

The filters 31.1, 31.2 are such that the central wavelengths $\lambda_{c1}$, $\lambda_{c2}$ of the spectral responses are different from each other. Two different filters 31.1, 31.2 are illustrated here by way of example, but the detecting device may include a plurality of sets of one or more identical filters, the filters being different from one set of filters to the next, depending on the number of separate spectral responses in the detection spectral domain.

The interference filters 31.1, 31.2 are adjacent and substantially coplanar with each other. In particular, the lower high-index layer 33A and the upper high-index layer 33B are respectively coplanar from one filter to the next, and are preferably common to all the filters. The thin encapsulating layer 21 is preferably common to all the filters 31.1, 31.2. The structured layers 35.1, 35.2 are here coplanar and have substantially the same thickness, just like the low-index layers 34A, 34B.

The interference filters 31.1, 31.2 differ from each other essentially as regards the lateral dimensions of the high-index sections 36.1, 36.2 and low-index sections 37.1, 37.2 of the structured layers 35.1, 35.2, which define the value of the central wavelengths $\lambda_{c1}$, $\lambda_{c2}$ of each spectral response.

In this example in which a plurality of thermal detectors are located in the same hermetic cavity 3, the thin encapsulating layer 21, and in particular its upper wall 22, extends above said detectors continuously. The thin encapsulating layer, in particular its upper wall 22, here forms the lower high-index layer 33A, or one of its sublayers, of the interference filters 31.1, 31.2.

Each filter 31.1, 31.2 is preferably positioned at a distance, from the absorbing membrane 11 of the facing detector, smaller than the lateral dimension of a pixel (area in the (X, Y) plane of the thermal detector), so as to prevent crosstalk between adjacent pixels, i.e. so as to prevent radiation transmitted by an interference filter being detected by a thermal detector neighbouring the detector located facing the filter in question.

FIGS. 10A to 10H illustrate various steps of a process for producing the device according to a third embodiment. In this example, the thin encapsulating layer 21 forms the high-index layer 33A of the lower semi-reflective mirror 32A, and the high-index layer 33B of the upper semi-reflective mirror 32B includes a sealing layer 336.2.

Figure 10A:
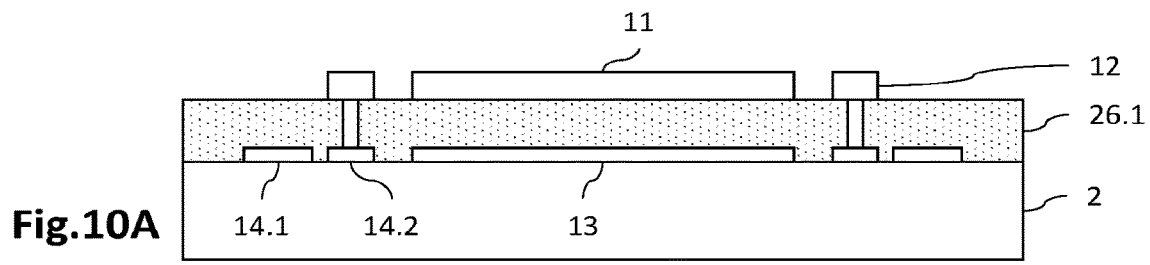
FIGS. 10A to 10H illustrate various steps of a method for producing a detecting device according to a third embodiment.

With reference to FIG. 10A, a matrix array of thermal detectors 10, which are each connected to an electronic circuit (for example a CMOS circuit) that is provided to supply power to and to measure the signals delivered by the detectors, is produced on a substrate 2. The thermal detectors 10 are for example micro-bolometers, each including a membrane 11 able to absorb the radiation to be detected, said membrane being suspended above the substrate 2 and being thermally insulated therefrom by anchoring pillars 12 and thermally insulating holding arms (not shown). Suspended membranes 11 are conventionally obtained by surface micro-machining techniques that consist in producing the absorbing membranes 11 on a first sacrificial layer 26.1 that is removed at the end of the process. Each absorbing membrane 11 furthermore includes an absorbing element that is heated and a thermometer element that measures the resulting temperature rise, for example taking the form of a thermistor connected to the CMOS electronic circuit by electrical connections provided in the anchoring pillars 12. Moreover, a reflective layer 13 rests on the upper surface of the substrate 2, i.e. the surface located facing the absorbing membrane 11. Tie sections also rest on the upper surface of the substrate 2, for example tie sections 14.1 on which the lateral wall of the thin encapsulating layer 21 is intended to rest, and tie sections 14.2 on which the anchoring pillars 12 rest.

Figure 10B:
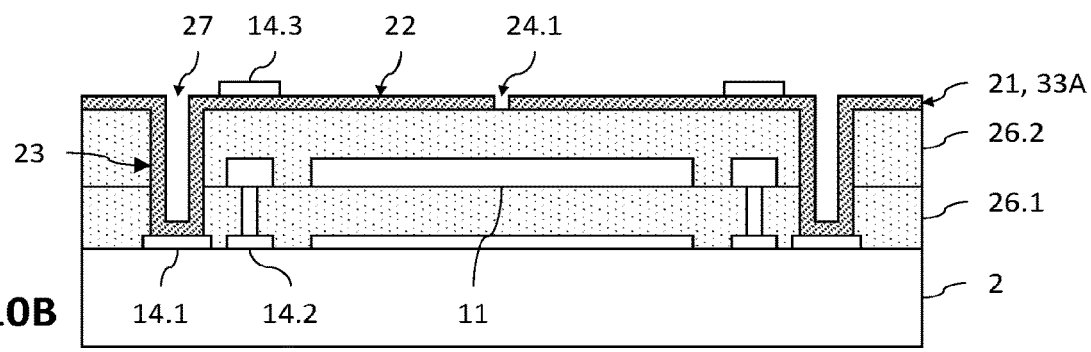
Figure 10C:
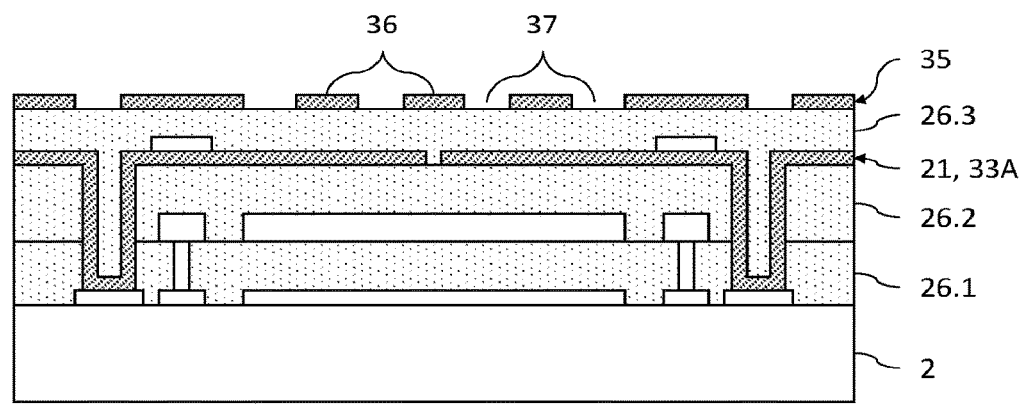

With reference to FIG. 10B, a second sacrificial layer 26.2, preferably of the same nature as the first sacrificial layer, is deposited, said layer for example being made of polyimide obtained by dispensing and spin coating. The sacrificial layer 26.2 covers the sacrificial layer 26.1, the absorbing membrane 11 and the anchoring pillars 12. By conventional photolithography techniques, the sacrificial layers 26.1 and 26.2 are then etched locally as far as the tie sections 14.1. The etched zones may take the form of trenches 27 of continuous and closed perimeter encircling one or more thermal detectors 10, or may take the form of grooves located between the detectors. Next, a first thin high-index layer 21, here of amorphous silicon, is deposited, for example by chemical vapour deposition (CVD), so as to cover both the upper surface of the second sacrificial layer 26.2 and the flanks of the trenches 27. The thickness of the high-index layer 21 made of amorphous silicon is about 0.73 µm in order to correspond to a quarter-wave plate at 10 µm. The high-index layer is intended to form the thin encapsulating layer 21 of the encapsulating structure, and the high-index layer 33A of the lower semi-reflective mirror 32A. It extends above and at distance from the absorbing membrane 11, and here continuously encircles, in the (X, Y) plane, one or more thermal detectors 10.

In this step, it is advantageous to deposit then locally etch sections 14.3 of a base material that will possibly be used by way of an etch-stop layer and/or of an adhesion layer for anchoring, in the locations where it is provided, supporting elements of a matrix array of multispectral interference filters. The choice of whether or not to produce these sections of base material, and where appropriate the nature of the base material, is determined depending on the other materials present, and in particular on the nature of the sacrificial layers and of the anchoring elements. In the present case of sacrificial layers made of polyimide and of anchoring structures made of silicon, the base sections 14.3 may be made, by way of example, of silicon oxide, silicon nitride, of titanium, or of aluminium.

Next, the thin encapsulating layer 21 is etched locally, so as to produce at least one first exhaust vent 24.1 through the thin encapsulating layer 21.

With reference to FIG. 10 C, next the following are deposited in succession: a third sacrificial layer 26.3, here made of polyimide, which covers the thin encapsulating layer 21 and the base sections 14.3, then a second high-index layer, here made of amorphous silicon, on the sacrificial layer 26.3. The thickness of the sacrificial layer 26.3 is here about 2.5 µm in order to advantageously correspond to a quarter-wave optical distance in free space or air, with respect to a reference wavelength—here 10 µm. The second high-index layer is intended to form the high-index sections 36 of the structured layer 35. Its optical thickness is here about 2 µm so as not to create unwanted resonances in the operating range of the multispectral detecting device. The second high-index layer may be deposited by a CVD deposition technique, which allows good control of the deposited thickness.

By photolithography and etching, the second amorphous silicon layer is then structured so as to produce an alternation, in the (X, Y) plane, of high-index sections 36 made of amorphous silicon and low-index sections 37. In this way it is possible to form a grid comprising periodic apertures, for example of a pitch P of 2 μm. The lateral dimensions, in the (X, Y) plane, of the high-index sections 36 are adjusted to obtain a structured layer 35 of predefined average optical index, and to obtain a spectral response taking the form of a transmission band centred on a set central wavelength. In the particular case where the structured layer 35 is a continuous layer without low-index sections 37, the second amorphous silicon layer is nonetheless etched locally to form second exhaust vents that will be required to remove the subjacent sacrificial layers 26.1, 26.2, 26.3. Vents of 0.5 μm width repeated with a pitch of 20 μm, or as much as 50 μm, may allow the desired result to be obtained without significantly disrupting the spectral response of the filter.

At this stage, when the detecting device is to be used for multispectral detection, provision is made for the lateral dimensions of the sections 36 and 37 of the structured layer 35 to be different for a plurality of thermal detectors, thereby allowing the elementary detectors to be endowed with a frequency selectivity that is defined by the lateral dimensions of the structured layer of each interference filter. It is also possible to provide a structured layer the motifs of which, i.e. the motifs formed by the sections 36 and 37, are arranged aperiodically above a given elementary detector, so as to widen the spectral response of the interference filter and therefore of the thermal detector in question.

Figure 10D:
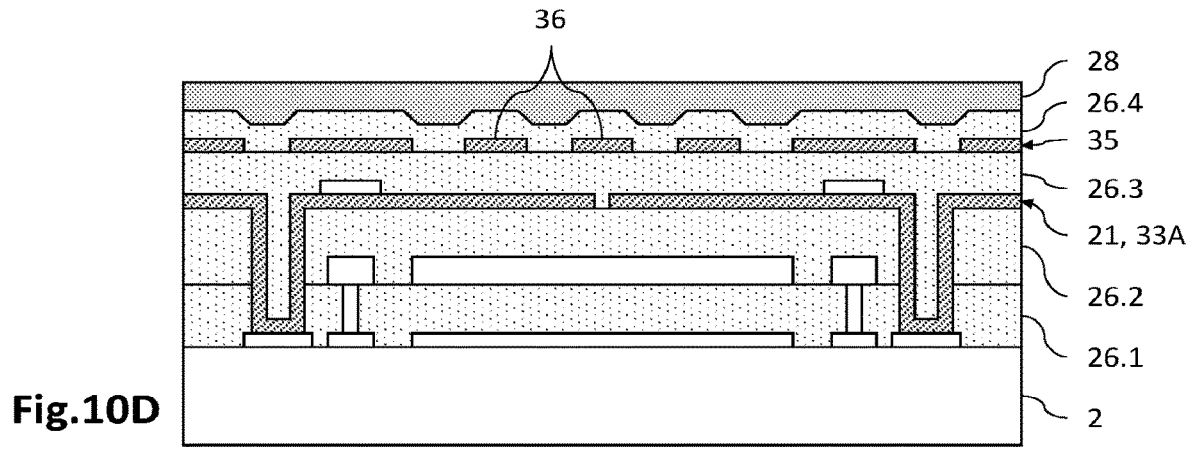
Figure 10E:
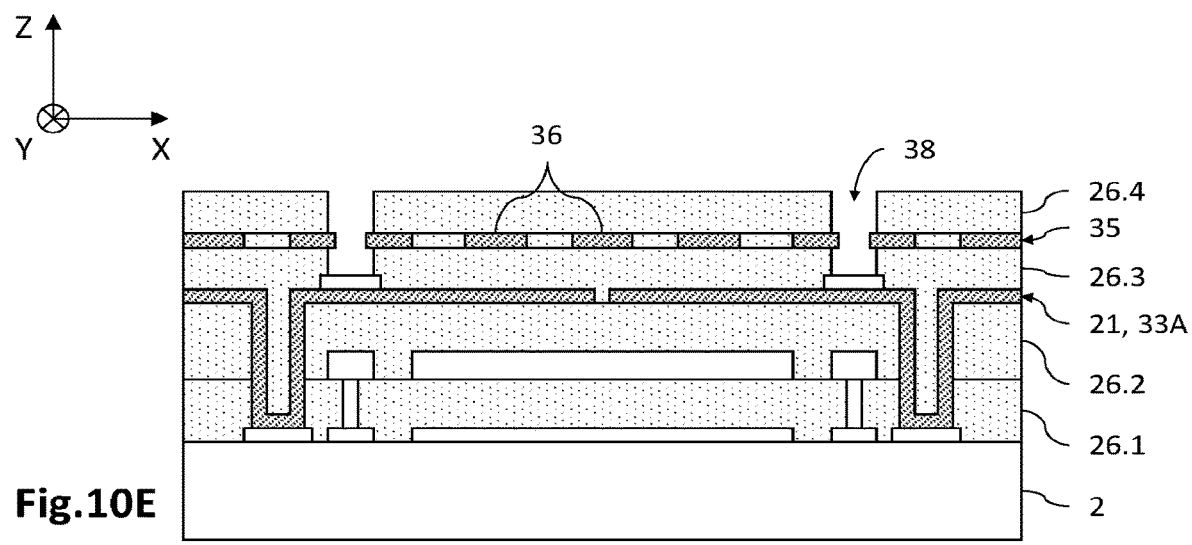

With reference to FIG. 10D, a first thickness of a fourth sacrificial layer 26.4, here made of polyimide, is deposited, preferably a thickness larger than 2 μm, 3 μm for example. Then a planarizing layer 28, for example a suitable photoresist, is deposited by dispensing and spin coating. The thickness of the planarizing layer 28, and the fluidity of the resist, are chosen so that after the spin coating the residual relief in the upper face of the sacrificial layer 26.4 is completely filled. A dry chemical etching step, for example in an oxygen plasma, then allows the planarizing layer 28 and the sacrificial layer 26.4 to be simultaneously etched, at an etch rate that is substantially identical for both materials, this leading to an essentially flat etch front. The etching step is stopped at the moment when the etch front uncovers the upper face of the high-index sections 36 of the structured layer 35. This instant may be detected automatically by an endpoint detecting device, for example via an optical-emission-spectroscopy analysis. At this stage, a structured layer 35 is obtained the high-index sections 36 of which each have an upper surface that is substantially not covered by any other material, and the gaps in which, in the (X, Y) plane, are filled by the sacrificial layer 26.4.

A similar result may be obtained by a chemical-mechanical polishing (CMP) process, though such a chemical mechanical polishing process would have to be adapted to the organic nature of the sacrificial layers, which here are made of polyimide. In the case where mineral sacrificial layers are used, for example layers made of silicon oxide as described below with regard to a fourth embodiment, a CMP process would be particularly advantageous.

With reference to Figure WE, a second thickness of the fourth sacrificial layer 26.4, which here is made of polyimide, is deposited, this thickness being about 2.5 μm. By photolithography and etching, continuous peripheral or localized and discontinuous trenches 38 are then produced by etching in succession: the sacrificial layer 26.4; the structured layer 35 level with a high-index section 36; and the sacrificial layer 26.3 as far as to the base sections 14.3, which advantageously act as an etch-stop layer. The etching sequence advantageously contains a step in which the sacrificial layers 26.3 and 26.4 made of polyimide are etched isotropically, so as to expose portions of the high-index sections 36, which portions then protrude into the trench 38. These protruding portions will facilitate the mechanical maintenance of the structured layer 35 with the supporting walls 40 of the optical filtering device.

Figure 10F:
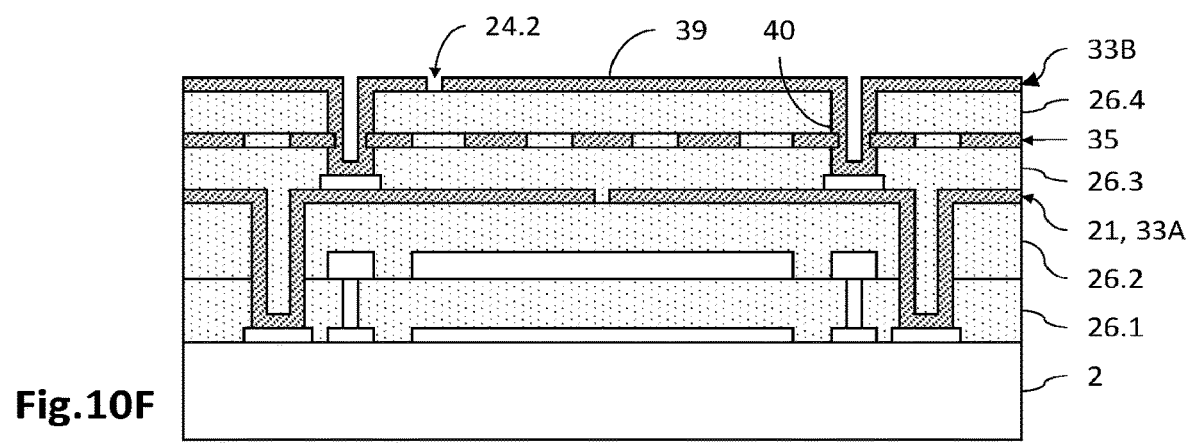

With reference to FIG. 10F, a third high-index layer, here made of amorphous silicon, is deposited, the thickness of which is about 0.73 μm in order to correspond to a quarter-wave plate at the reference wavelength of 10 μm. Conformal deposition, for example by CVD, is particularly advantageous in so far as it allows the third high-index layer to cover the flank of the trenches 38. Good coverage of the etched flanks allows, with a given high-index layer, both of the following to be produced: the upper wall 39 of the high-index layer 33B of the upper semi-reflective mirror 32B, and an (optionally peripheral) lateral wall 40 for supporting the optical filtering device on the encapsulating structure. Advantageously, the lateral wall 40 makes contact with the protruding portions of the high-index sections 36 exposed in the trenches 38, thereby allowing the structured layer 35 to be securely fastened to the optical filtering structure. An etching step allows exhaust vents 24.2 to be produced through the upper wall 39 of the high-index layer 33B.

Figure 10G:
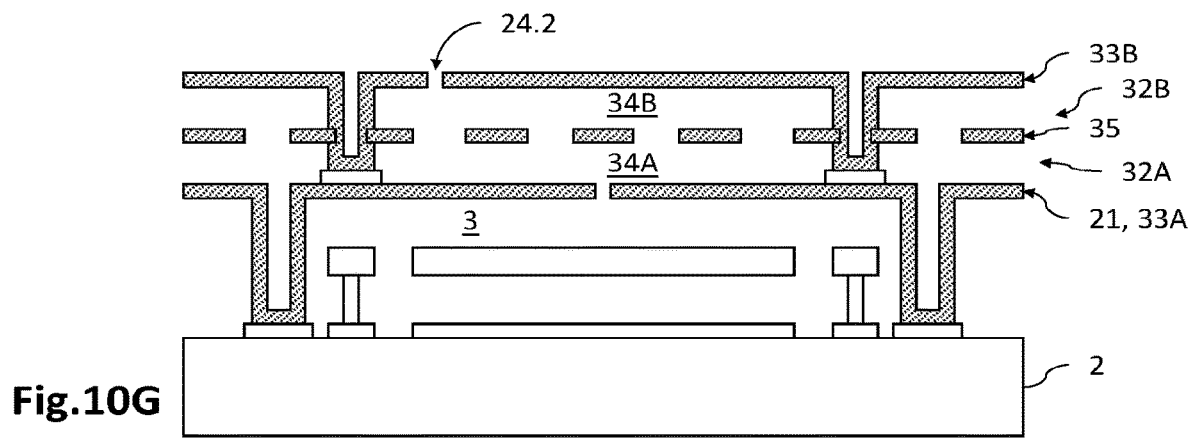

With reference to FIG. 10G, the various sacrificial layers 26.1, 26.2, 26.3, 26.4 are removed, for example by dry etching in an oxygen plasma optionally also containing $N_2$ and $CF_4$, through the various exhaust vents 24.1 and 24.2 and through the gaps in the high-index sections 36, which will form the low-index sections 37, so as to release the absorbing membrane 11 of the thermal detector, and so as to obtain the low-index layers 34A, 34B of the lower and upper mirrors 32A and 32B, and the low-index sections 37 of the structured layer 35. Thus a large-index-difference interference filter including a structured layer 35 suspended between two semi-reflective mirrors 32A, 32B is obtained.

According to one variant, the detecting device thus obtained is then integrated into a hermetic cavity containing a vacuum or a low-pressure atmosphere, for example into a hermetic package inside of which the substrate 2 of the device is placed. The pumping out of the package creates a vacuum via the vents 24.1 and 24.2, and hence thermal detectors with membranes that are thermally insulated by the vacuum, and large-index-difference interference filters using amorphous silicon by way of high-index material (n=3.5) and the vacuum by way of low-index medium (n=1) are obtained simultaneously.

Figure 10H:
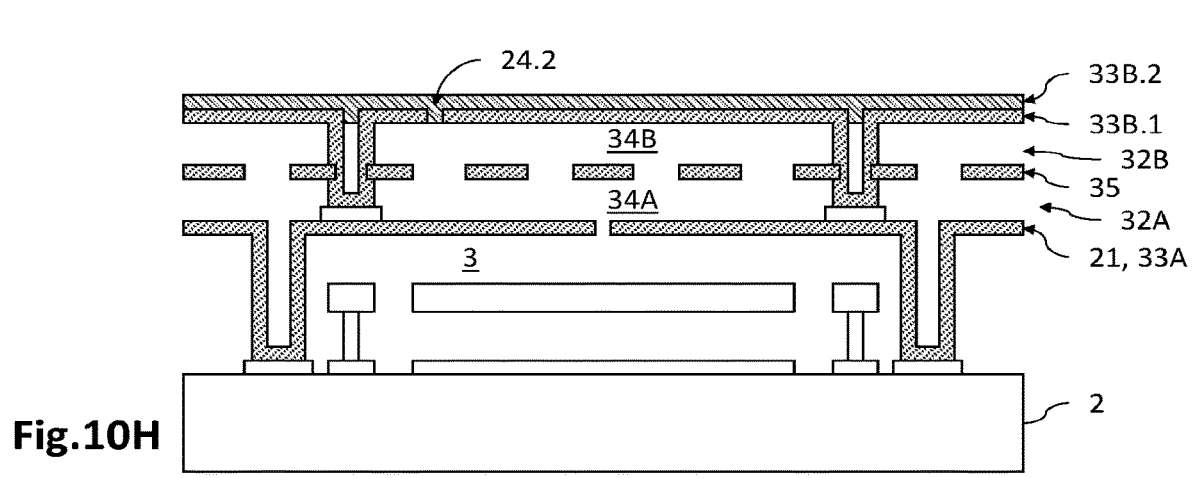

According to another variant illustrated in FIG. 10H, following the step of removing the sacrificial layers 26.1, 26.2, 26.3, 26.4, the detecting device is pumped out and a sealing layer 33B.2 is deposited on the amorphous silicon layer 33B.1 of the upper mirror 32B, so as to block the exhaust vent 24.2. The cavity 3 is then under vacuum and is made hermetic by the sealing layer 336.2. The sealing layer 33B 0.2 is made of a high-index material, germanium for example, i.e. its refractive index is higher than that of the medium of the low-index layers 34A, 34B, and of the medium of the low-index sections 37. Its thickness, for example here 1.2 μm, is adjusted such that the stack of the sublayer 33B.1 of amorphous silicon and the sublayer 33B.2 of germanium forms a three-quarter-wave plate for a reference wavelength of 10 μm.

According to another variant (not shown), following the step of removing the sacrificial layers 26.1, 26.2, 26.3, 26.4, the detecting device is pumped out, and a pad of a sealing material is deposited level with the vent 24.2, so as to seal the cavity 3, which then contains a vacuum, hermetically. The high-index layer 33B of the upper semi-reflective mirror 32B then includes only the amorphous silicon layer.

Thus, because the sacrificial layers 26.1, 26.2, 26.3 and 26.4 are made from the same material, here polyimide, and because of the presence of the exhaust vents 24.1 and 24.2 and the gaps between the high-index sections 36, it is possible to remove the various sacrificial layers in a single step, and therefore to simultaneously release the suspended membrane 11 and the structured layer 35. The producing process is therefore greatly simplified.

This is further accentuated by the fact that the semi-reflective mirrors each include only a single high-index layer, and advantageously one low-index layer located between the high-index layer and the structured layer, and not a superposition of a plurality of high-index layers separated from one another by low-index layers as in the conventional case of multilayer dielectric mirrors.

The process thus allows the structured layer to be simply and rapidly released and at least one low-index layer to be formed, without any effect on the quality of the spectral response of the filter, in terms of transmission selectivity and rejection quality.

Thus, the one or more low-index layers of the semi-reflective mirrors may be obtained with the sacrificial-layer-removing process used in the production of the micro bolometer. The fact that the stack of each of the mirrors is restricted to a single high-index layer limits to only two the number of sacrificial layers in the Fabry-Perot cavity, thereby allowing these two layers to be released in a single step. The process for producing the matrix array of filters is thus particularly simple, with few layers to be deposited, a single releasing step, and a single structuring step. It is surprising to be able to obtain with this simplified interference-filter architecture and a simple producing process compatible with that of the microbolometer, spectral responses that remain selective in terms of transmission-peak thinness and in terms of rejection ratio.

Figure 11A:
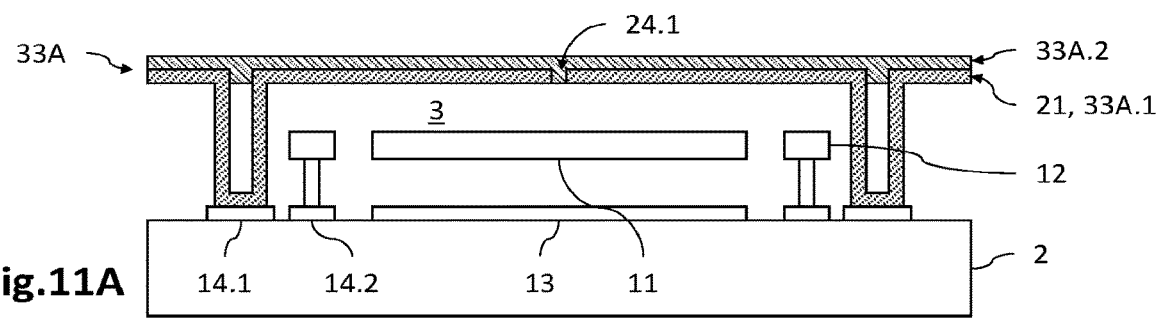
FIGS. 11A to 11C illustrate various steps of a method for producing a detecting device according to a fourth embodiment.
Figure 11B:
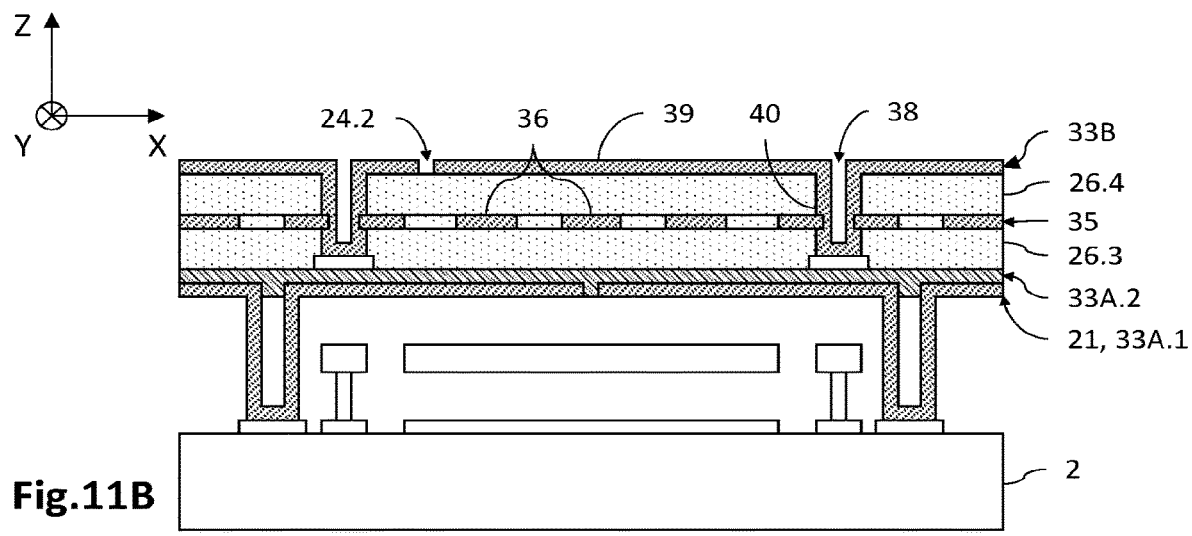
Figure 11C:
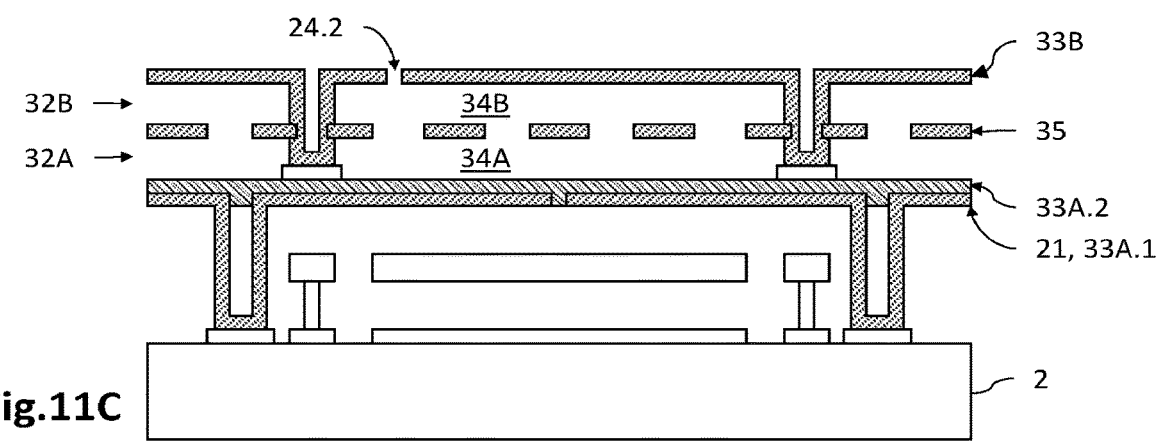

FIGS. 11A to 11C illustrate various steps of a process for producing the device according to a fourth embodiment. In this example, only the lower mirror 32A includes a sealing sublayer 33A.2 making the cavity 3 hermetic.

With reference to FIG. 11A, a matrix array of thermal detectors is produced on a substrate 2 including a CMOS electronic circuit and an encapsulating structure forming with the substrate 2 a hermetic cavity 3 in which one or more thermal detectors are located. Here, a sealing layer 33A.2 is deposited on a thin encapsulating layer 21 with a sufficient thickness to ensure the exhaust vent 24.1 is sealed i.e. blocked. The thin encapsulating layer 21 furthermore forms a sublayer 33A.1 of the high-index layer 33A of the lower semi-reflective mirror 32A, whereas the sealing layer 33A.2 forms a second sublayer of the high-index layer 33A. The thin encapsulating layer 21 may be a first layer made of amorphous silicon, for example of 0.73 μm thickness. The sealing layer 33A.2 is also transparent to infrared radiation, and may for example be a layer of germanium, preferably deposited by a thin film vacuum deposition technique such as electron beam physical vapour deposition (EBPVD). Thus, a hermetic cavity 3 containing a vacuum or a low-pressure atmosphere is obtained, in which cavity the matrix array of detectors is housed. As patent application FR1551487 describes, the average transverse width X of the vent 24.1 may be chosen depending on the thickness e of the deposited sealing layer, on the fraction of the thickness B of the sealing layer 33A.2 actually ensuring the hermeticity, and on the growth angle α of the sealing layer 33A.2, using the relationship: $X=2.e.(1-B).\tan(\alpha)$. By way of example, when the deposition technique used to deposit the sealing layer 33A.2 is evaporation, the angle α is typically of the order of 15° to 20°.

For a thickness of the thin encapsulating layer 21 made of amorphous silicon of 0.73 μm, it is advantageous to provide a sealing layer 33A.2 made of germanium of 1.25 μm thickness so as to obtain a high-index layer 33A forming a three-quarter-wave plate for a reference wavelength of 10 μm, thereby allowing an interference filter with a single transmission peak in the detection spectral domain 8-14 μm to be obtained. If it is desired for two thirds of the sealing layer, i.e. 0.83 μm of germanium, to ensure the hermeticity of the cavity 3, an average transverse width X of the vent comprised preferably between 0.22 μm and 0.3 μm is obtained.

With reference to FIG. 11B, the structured layer 35 and the high-index layer 33B are produced on the sacrificial layers 26.3 and 26.4 in steps as described above, except that they are produced on a hermetic cavity 3 containing a vacuum or a low-pressure atmosphere, in which cavity one or more thermal detectors are housed. Thus a matrix array of detectors housed alone or in a number of two or more in one or more hermetic cavities 3 formed by an encapsulating structure is obtained, an optical filtering structure including a matrix array of filters each of which is placed facing one thermal detector resting on said encapsulating structure. The hermetic cavity 3 is free of any sacrificial layer whereas the filters include sacrificial layers 26.3 and 26.4 between the high-index layers 33A.1 and 33A.2, and 33B, and level with the structured layer 35.

With reference to FIG. 11C, the third and fourth sacrificial layers 26.3, 26.4 are then removed through the exhaust vent 24.2 and the gaps in the high-index sections 36, so as to form a large-index-difference interference filter including a structured layer 35 comprising high-index sections 36 made of amorphous silicon and low-index air sections, said structured layer being suspended between the high-index layers 33A.1 and 33A.2, and 33 A of the semi-reflective mirrors 32A, 32B, each of which furthermore includes a low-index layer 34A, 34B separating the corresponding high-index layer from the structured layer. In this embodiment, the third and fourth sacrificial layers 26.3, 26.4 are removed in a different step from that in which the first and second sacrificial layers 26.1, 26.2 are removed. Thus, these two pairs of sacrificial layers may be made from different materials, the third and fourth sacrificial layers 26.3, 26.4 possibly, for example, being made of silicon oxide, which may be removed by chemical etching in HF vapour. The use of silicon oxide instead of polyimide may simplify the step of planarization of the first thickness of the fourth sacrificial layer 26.4 as then a CMP technique may preferably be used. The base layer 14.3 will possibly for example be made of aluminium, so as to resist the vapour-phase HF etching.

As a variant (not shown) it may then be advantageous to block the vent 24.2 by depositing a thin layer that is transparent to infrared radiation, for example a layer of germanium or a layer of amorphous silicon. This additional sealing sublayer may be provided to form, conjointly with the amorphous silicon sublayer, a three-quarter-wave plate for the reference wavelength of 10 μm, thereby allowing an interference filter with a single transmission peak in the detection spectral domain 8-14 μm to be obtained. In this respect, a sealing layer made of amorphous silicon of 1.5 μm thickness or a layer of germanium of 1.25 μm thickness may be deposited on the layer 33B of amorphous silicon of 0.73 μm thickness. The advantage of blocking the vent 24.2 is to prevent exterior agents, liable to degrade the mechanical strength of the filters, from penetrating into the interior of the interference filters. It is not necessary for this additional sealing layer to have the function of keeping the cavities of the interference filters under vacuum, and hence intermediate pressure deposition techniques (cathode sputtering, CVD for example) may be used with the advantage of shortening the deposition step, thereby contributing to decreasing the production cost of the detecting device. Advantageously, an antireflection layer (for example a quarter-wave layer made of ZnS, or a textured layer made of Si) may be deposited on top of the stack in order to improve the rejection ratio at the two ends of the detection spectral domain 8-14 μm.

FIGS. 12A to 12E illustrate various steps of a process for producing the device according to a fifth embodiment. In this example, the lower semi-reflective mirror 32A includes a sealing sublayer 33A.2, and the structured layer 35 includes a continuous high-index layer 41 on which an alternation of high-index sections 36 and low-index sections 37 rests.

Figure 12A:
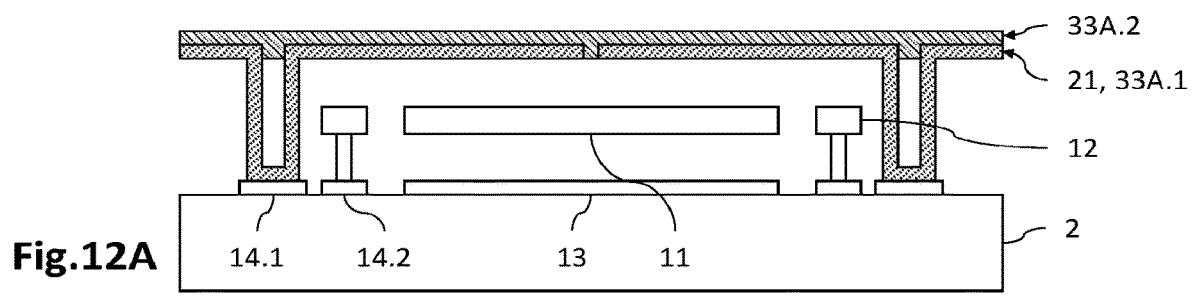
FIGS. 12A to 12E illustrate various steps of a method for producing a detecting device according to a fifth embodiment.

FIG. 12A is identical or similar to FIG. 11A and is therefore not described in detail. A matrix array of thermal detectors 10 rests on the substrate 2 and an encapsulating structure, formed from a thin encapsulating layer 21 and here a sealing layer 33A.2, defines with the substrate 2 one or more hermetic cavities 3 each housing one or more thermal detectors 10.

Figure 12B:
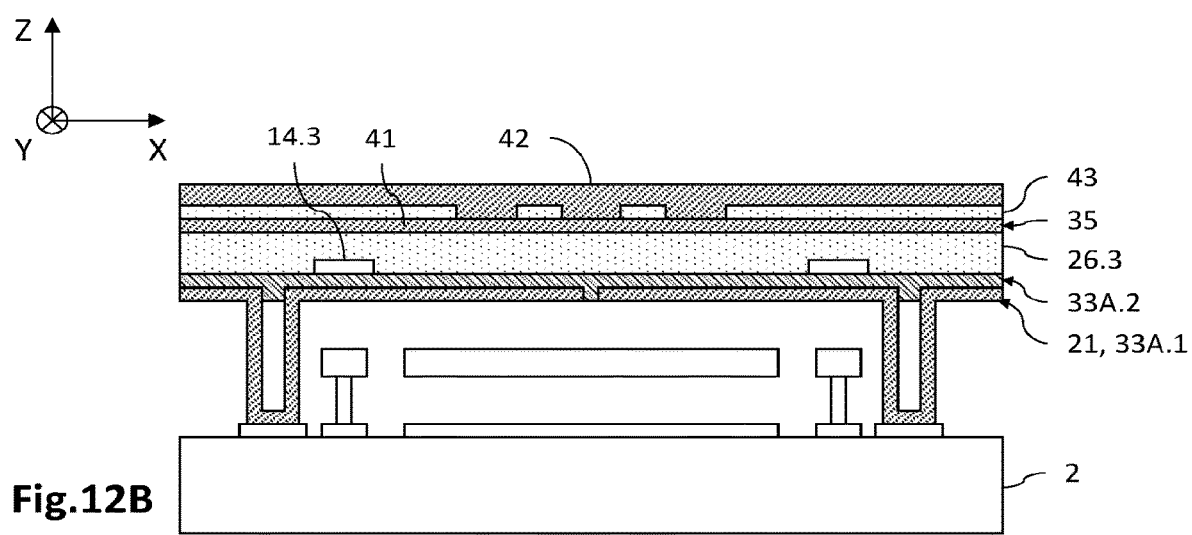

With reference to FIG. 12B, next base sections 14.3, which are identical or similar to those described above, are produced, these base sections being optional, and a third sacrificial layer 26.3, for example made of silicon oxide, is deposited so as to cover the base sections 14.3 and the sealing layer 33A.2. By way of example, the third and fourth sacrificial layers 26.3 and 26.4 are here made of silicon oxide but polyimide could be used.

Next, the following are deposited: a high-index layer 41, here made of amorphous silicon, for example of 0.73 μm thickness, so as to cover the sacrificial layer 26.3, then a thin etch-stop layer 43, preferably made of silicon oxide so as to be removable with the sacrificial layers 26.3 and 26.4, with a thickness in a range comprised between 10 nm and 200 nm and for example between 30 nm and 50 nm. By photolithography and etching of the etch-stop layer 43, here apertures taking the form of holes that open onto the subjacent layer 41 are produced. In one variant (not shown) the etch-stop layer 43 may be etched so that only pads placed on the layer 41 remain. Afterwards, a high-index layer 42, here made of amorphous silicon, for example of 1.36 μm thickness is deposited. Preferably, the high-index layer 41 has a thickness smaller than about 60% of the total thickness of the layers 41 and 42, in order to limit unwanted resonances in the operating range of the multispectral detecting device.

Figure 12C:
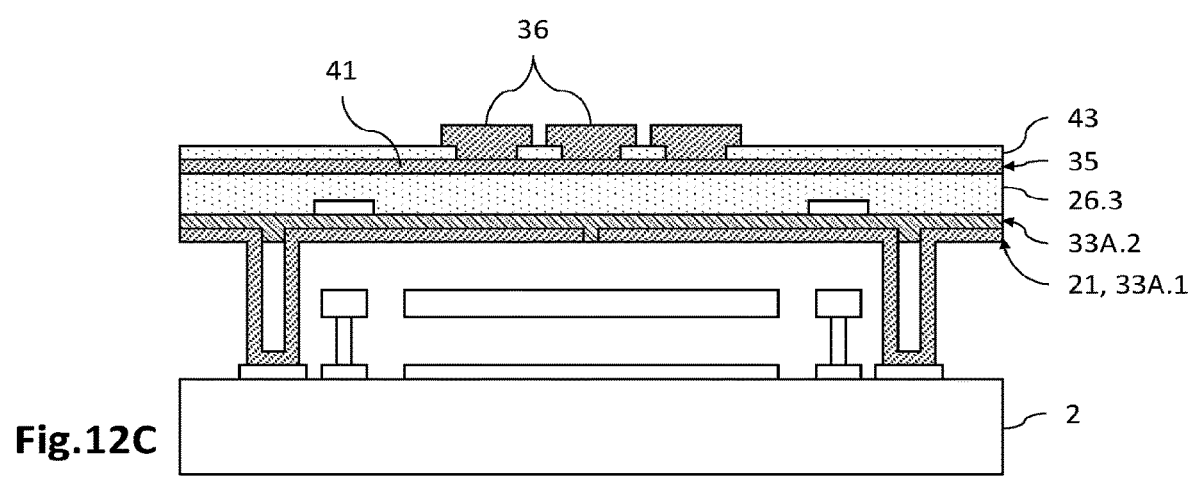

With reference to FIG. 12C, next, by photolithography and etching of the high-index layer 42, a network of high-index sections 36 is produced. Each section 36 thus has a thickness substantially equal to the thickness of the initial layer 42, and makes contact with the subjacent continuous high-index layer 41.

Figure 12D:
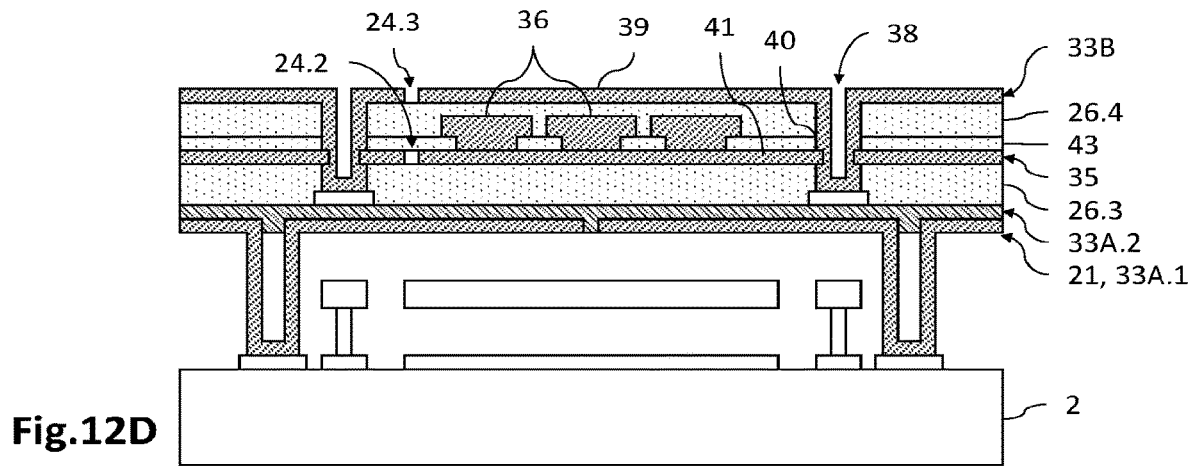
Figure 12E:
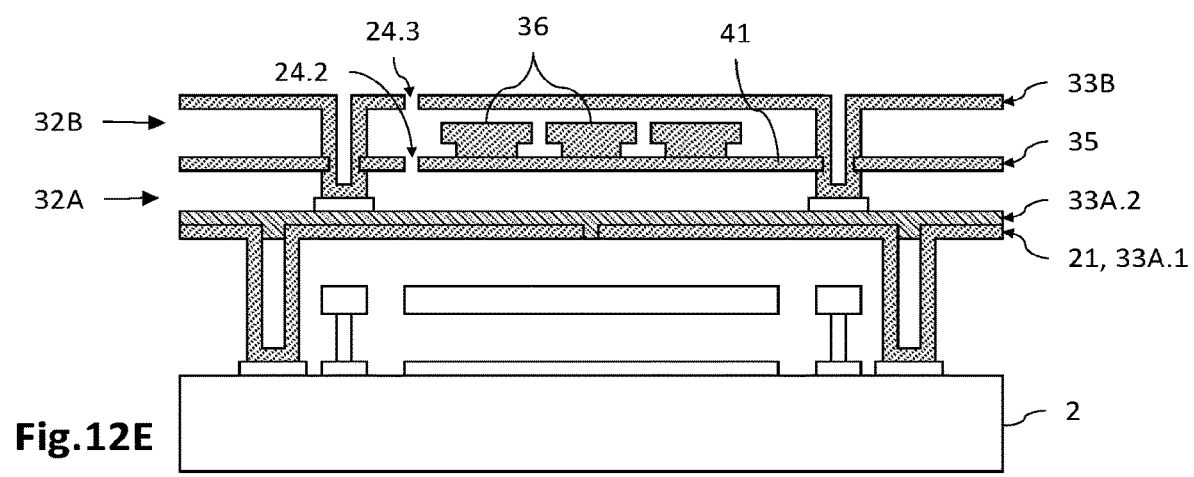

With reference to FIGS. 12D and 12E, steps such as those described above are carried out, but, in the present case, provision is made to remove the etch-stop layer 43 at the same time as the sacrificial layers 26.3 and 26.4 made of silicon oxide are removed. These layers 26.3, 43 and 26.4 made of silicon oxide are removed by HF-vapour acid etching, through the second and third vents 24.2 and 24.3, which are provided in the continuous layer 41 of the structured layer 35 and in the high-index layer 33 B of the upper mirror 32B, respectively. Thus an interference filter the structured layer of which includes a continuous high-index layer 41 on which the high-index sections 36 rest is obtained. The continuous layer 41 makes contact with the lateral wall 40 so as to ensure the mechanical solidity of the structured layer 35.

In this embodiment, the second vent 24.2 may be opened at a number of stages, either after the continuous layer 41 has been deposited, or between the etching of the layer 43 and the deposition of the sacrificial layer 26.4 (if the second option is chosen, 2 layers, which are sequentially made of silicon oxide and amorphous silicon, are etched together) (this second option requires a mask level and an etching step dedicated to producing the second vents), or at the same time as the third vent 24.3 is produced. Other approaches are possible. Optionally, the third vents 24.3 could be blocked, as described above, by depositing a thin sealing layer that is transparent to infrared radiation, for example made of germanium, or even an antireflection layer made of ZnS.

Figure 13A:
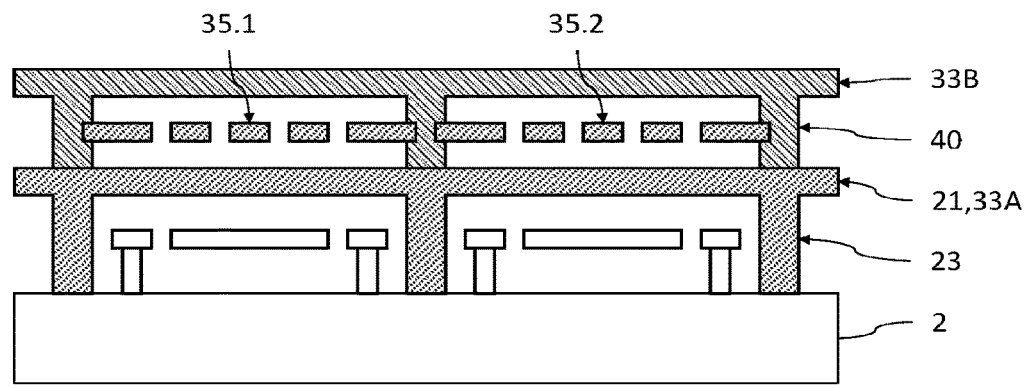
FIGS. 13A to 13C illustrate various variants of the detecting device.
Figure 13B:
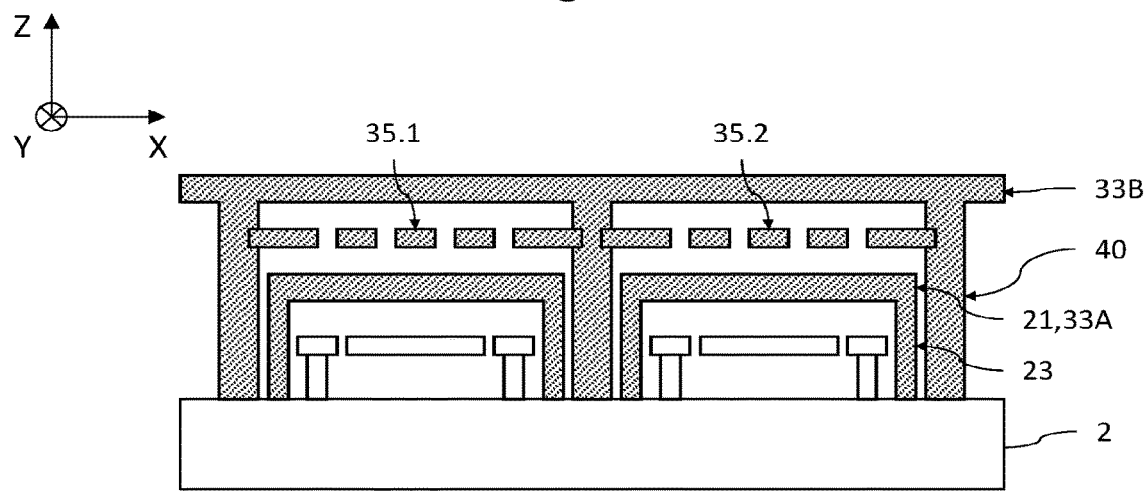
Figure 13C:
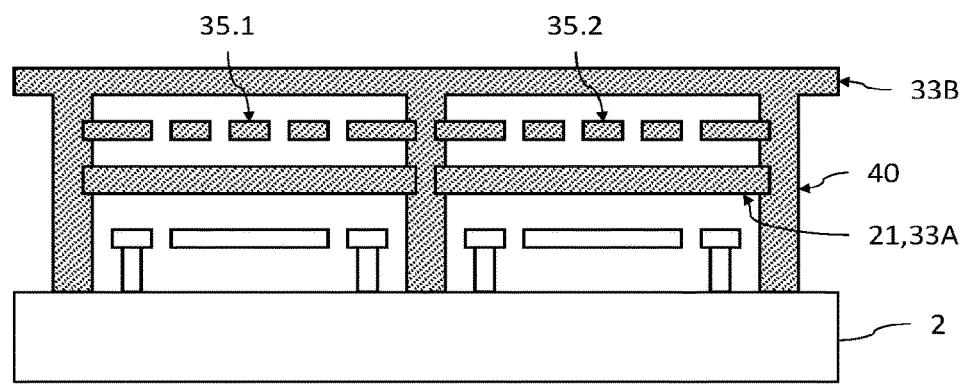

FIGS. 13A to 13C illustrate various variants of the device for detecting electromagnetic radiation, which differ from one another essentially in the way in which the optical filtering structure rests on the substrate 2.

FIG. 13A shows a schematic cross-sectional view in which the elements 40 for supporting the matrix array of multispectral interference filters rest on the upper face of the encapsulating structure, such as described up to now.

FIG. 13B shows a schematic cross-sectional view in which the walls 40 supporting the matrix array of multispectral interference filters rest on the upper face of the substrate 2. The encapsulating structure therefore does not ensure the mechanical maintenance of the optical filtering structure.

FIG. 13C shows a schematic cross-sectional view in which the supporting walls 40 rest on the upper face of the substrate 2 and support both a matrix array of multispectral interference filters and the thin the encapsulating layer of the thermal detectors.

Particular embodiments have just been described. Various variants and modifications will appear obvious to those skilled in the art. In particular, it is possible for the optical filtering structure to include a plurality of interference filters per thermal detector, the filters then being superposed on top of one another along the Z-axis.

The invention claimed is:

1. A device for detecting electromagnetic radiation, comprising:
    a substrate;
    at least one thermal detector, placed on the substrate;
    an encapsulating structure arranged so as to define with the substrate a cavity housing said thermal detector, including a thin encapsulating layer extending above the thermal detector; and
    at least one Fabry-Perot interference filter supported by the encapsulating structure and away from the thermal detector, said filter being formed by first and second semi-reflective mirrors that are separated from each other by a structured layer, the structured layer being distinct from the first and second semi-reflective mirrors,
    each semi-reflective mirror including a high-refractive-index layer made of at least one dielectric or semiconductor material, said high-refractive-index layer having a thickness equal to a multiple of a ratio of a reference wavelength comprised in a detection spectral domain of the thermal detector over four times its refractive index, the structured layer including an alternation, in a plane parallel to a plane of the substrate, of high-refractive-index sections made from at least one dielectric or semiconductor material, and low-refractive-index sections made from a medium a refractive index of which is lower than that of the material of the high-refractive-index sections, the high-refractive-index layer of one of said semi-reflective mirrors being at least partially formed from said thin encapsulating layer, and the thin encapsulating layer extends continuously around the thermal detector so as to form an upper wall located above the thermal detector and a lateral wall resting on the substrate.

2. The detecting device according to claim 1, wherein each said semi-reflective mirror comprises a single said high-refractive-index layer, and at least one of said semi-reflective mirrors includes a low-refractive-index layer made from a medium a refractive index of which is lower than that of the material of the high-refractive-index layer, said low-refractive-index layer being located between the single high-refractive-index layer and the structured layer.

3. The detecting device according to claim 2, wherein a difference between the refractive index of the high-refractive-index layer and that of the medium of the low-reflective-index layer is larger than or equal to 1.5.

4. The detecting device according to claim 2, wherein the medium of the low-refractive-index layer and of the low-refractive-index sections is vacuum or a gas.

5. The detecting device according to claim 1, wherein the high-refractive-index layer of at least one of said semi-reflective mirrors is formed from a stack of at least two sublayers that make contact with one another and that are made from different materials.

6. The detecting device according to claim 1, wherein the structured layer has a proportion by volume of the high-refractive-index sections higher than or equal to 30%.

7. The detecting device according to claim 1, wherein the structured layer comprises a continuous layer on which the high-refractive-index sections rest.

8. The detecting device according to claim 1, wherein the high-refractive-index layer of an upper semi-reflective mirror of said first and second semi-reflective mirrors includes a lower surface located facing the structured layer and the structured layer being maintained above the high-refractive-index layer of a lower semi-reflective mirror of said first and second semi-reflective mirrors.

9. The detecting device according to claim 1, comprising:
a plurality of thermal detectors placed on the substrate, above which detectors said thin encapsulating layer extends;
a plurality of Fabry-Perot interference filters each supported by the encapsulating structure;
the thin encapsulating layer being common to a plurality of high-refractive-index layers of one of said semi-reflective mirrors of the plurality of interference filters.

10. The detecting device according to claim 9, wherein the semi-reflective mirrors and the structured layers of the interference filters are respectively coplanar from one interference filter to the next.

11. The detecting device according to claim 1, wherein the medium of the low-refractive-index sections is vacuum or a gas, each said semi-reflective mirror includes a low-refractive-index layer made from a medium a refractive index of which is lower than that of the material of the high-refractive-index layer, said low-refractive index layers being on opposite sides of the structured layer.

12. The detecting device according to claim 1, wherein the upper wall and the lateral wall of the thin encapsulating layer are part of a same layer and made from a same material.

13. The detecting device according to claim 1, wherein the lateral wall is a peripheral wall that extends continuously around the thermal detector in a plan view of the device.

14. The detecting device according to claim 1, wherein the cavity is a hermetic cavity.

15. A device for detecting electromagnetic radiation, comprising:
a substrate;
at least one thermal detector, placed on the substrate;
an encapsulating structure arranged so as to define with the substrate a cavity housing said thermal detector, including a thin encapsulating layer extending above the thermal detector; and
at least one Fabry-Perot interference filter supported by the encapsulating structure and away from the thermal detector, said filter being formed by first and second semi-reflective mirrors that are separated from each other by a structured layer, the structured layer being distinct from the first and second semi-reflective mirrors,
each semi-reflective mirror including a high-refractive-index layer made of at least one dielectric or semiconductor material, said high-refractive-index layer having a thickness equal to a multiple of a ratio of a reference wavelength comprised in a detection spectral domain of the thermal detector over four times its refractive index,
the structured layer including an alternation, in a plane parallel to a plane of the substrate, of high-refractive-index sections made from at least one dielectric or semiconductor material, and low-refractive-index sections made from a medium a refractive index of which is lower than that of the material of the high-refractive-index sections,
the high-refractive-index layer of one of said semi-reflective mirrors being at least partially formed from said thin encapsulating layer, and
the high-refractive-index layer of an upper semi-reflective mirror of said first and second semi-reflective mirrors includes an upper wall located facing the structured layer, and lateral walls located on either side of the upper wall, the structured layer being maintained above the high-refractive-index layer of a lower semi-reflective mirror of said first and second semi-reflective mirrors by the lateral walls.

16. A process for producing the device according to claim 15, comprising at least the following steps:
a. producing said at least one thermal detector;
b. producing said encapsulating structure arranged so as to define with the substrate the cavity housing said at least one thermal detector, including the thin encapsulating layer extending above the thermal detector and resting on a sacrificial layer covering said thermal detector;
c. producing said at least one Fabry-Perot interference filter, a sacrificial layer being located between the high-refractive-index sections of the structured layer; and
d. removing said sacrificial layers.

17. The producing process according to claim 16, wherein the sacrificial layers are removed in the same step, subsequently to the step of producing the interference filter, the sacrificial layers being made from the same material, the high-refractive-index layers of the first and second semi-reflective mirrors each including a through-orifice, and the low-refractive-index sections of the structured layer being through-sections.

18. The producing process according to claim 16, wherein the sacrificial layers are removed in two substeps comprising:
- a first sub-step of removing the sacrificial layer on which the thin encapsulating layer rests, carried out before the step of producing the interference filter, the thin encapsulating layer including a through-orifice, and a sealing layer then being deposited on the thin encapsulating layer so as to block the through-orifice; and
- a second sub-step of removing the sacrificial layer located between the high-refractive-index sections of the structured layer, the high-refractive-index layer of an upper semi-reflective mirror of said first and second semi-reflective mirrors including a through-orifice.

* * * * *